United States Patent
Chaya et al.

(10) Patent No.: US 7,026,832 B2
(45) Date of Patent: Apr. 11, 2006

(54) PROBE MARK READING DEVICE AND PROBE MARK READING METHOD

(75) Inventors: Hiromi Chaya, Kyoto (JP); Takahisa Hayashi, Kyoto (JP); Shigekazu Komatsu, Yamanashi (JP)

(73) Assignees: Dainippon Screen Mfg. Co., Ltd., Kyoto (JP); Tokyo Electron Limited, Tokyo (JP)

( * ) Notice: Subject to any disclaimer, the term of this patent is extended or adjusted under 35 U.S.C. 154(b) by 165 days.

(21) Appl. No.: 10/681,271

(22) Filed: Oct. 9, 2003

(65) Prior Publication Data

US 2004/0081349 A1    Apr. 29, 2004

(30) Foreign Application Priority Data

Oct. 28, 2002   (JP) ................. P2002-312579
Jul. 9, 2003    (JP) ................. P2003-194541

(51) Int. Cl.
*G01R 31/02*   (2006.01)
*G06K 9/00*    (2006.01)

(52) U.S. Cl. ...................... 324/754; 382/145

(58) Field of Classification Search .. 356/237.1–237.6; 382/145, 151, 286; 324/754, 758, 73.1, 690, 324/765; 438/14–25
See application file for complete search history.

(56) References Cited

U.S. PATENT DOCUMENTS

| | | | | |
|---|---|---|---|---|
| 4,943,767 A | * | 7/1990 | Yokota | 324/758 |
| 5,355,081 A | * | 10/1994 | Nakata et al. | 324/765 |
| 5,410,259 A | * | 4/1995 | Fujihara et al. | 324/758 |
| 5,585,738 A | * | 12/1996 | Kuji et al. | 324/754 |
| 5,642,432 A | * | 6/1997 | Mori | 382/145 |
| 5,644,245 A | * | 7/1997 | Saitoh et al. | 324/754 |
| 5,808,744 A | | 9/1998 | Moriya | |
| 6,096,567 A | * | 8/2000 | Kaplan et al. | 438/14 |
| 6,384,898 B1 | | 5/2002 | Inoue et al. | |
| 6,777,968 B1 | * | 8/2004 | Kobayashi et al. | 324/758 |

FOREIGN PATENT DOCUMENTS

| | | |
|---|---|---|
| JP | 5-3230 | 1/1993 |
| JP | 9-222311 | 8/1997 |
| JP | 10-223521 | 8/1998 |
| JP | 10-281729 | 10/1998 |
| JP | 11-326233 | 11/1999 |

* cited by examiner

*Primary Examiner*—Hwa (Andrew) Lee
*Assistant Examiner*—Sang H. Nguyen
(74) *Attorney, Agent, or Firm*—McDermott Will & Emery LLP

(57) ABSTRACT

A probe mark reading device for reading probe marks stormed on electrode pads of semiconductor chips contained in a semiconductor wafer (90), comprising a CCD camera (20) for taking an image of the semiconductor wafer (90) and outputting the image as an image signal Si, an optical unit (21) for optically enlarging a location to be photographed by the CCD camera (20), a light source (30) for illuminating the location to be photographed by the CCD camera (20) with a flash of light generated for a short period of time from when a flash signal Sf is provided, an X-Y stage (40) capable of changing a position to be photographed by the CCD camera (20) based on a motor control signal Sm by moving a mounted semiconductor wafer (90) in an X-direction and a Y-direction, and a computer (10) for providing control and saving the images after receiving and trimming the image signal Si. With the above configuration, it is possible to read probe marks in a short time without a user having to expend much time or effort.

13 Claims, 21 Drawing Sheets

IMAGE A  IMAGE B  IMAGE C

PROBE MARK READING DEVICE AND PROBE MARK READING METHOD

BACKGROUND OF THE INVENTION

1. Field of the Invention

The present invention relates to a probe mark reading device and a probe mark reading method for reading probe marks formed on electrode pads by examining electrical characteristics of a prescribed object (for example, a semiconductor chip).

2. Description of the Related Art

Normally, in order to examine electrical characteristics of a semiconductor chip formed on a semiconductor wafer, pin-shaped test probes are pressed against electrode pads within the semiconductor chip. Electrode pads are typically made from aluminum and are typically covered in an insulating aluminum oxide covering formed by oxidation at the time of examination. The test probe is therefore pushed against the electrode pad with a certain amount of force in order to break through the covering. As a result, probe marks (contact imprints) are formed by the test probe. A determination can then be made as to whether or not the test probe has been correctly pushed against the electrode pad by reading probe mark conditions such as the presence or absence, position, and depth etc. of a probe mark.

In the related art, devices for observing conditions of probe marks using a microscope, devices that take photographs of the probe marks, and devices that take pictures of the probe marks using a CCD camera exist as probe mark reading devices for reading conditions for probe marks. In Japanese Patent Laid-open Publication No. Hei. 5-3230, a probe mark reading device is disclosed where a semiconductor wafer on which semiconductor chips are formed is mounted on a stage. Images obtained by taking pictures of probe marks formed on electrode pads with a CCD camera are then stored and displayed in an appropriate manner. With this configuration, age deterioration in a probe mark is checked and temporal changes in test probe pin-pressure and pin-shifts can be managed.

With devices detecting targets different from the electrode pads, such as, for example, tape inspecting devices for inspecting repetitive patterns disclosed in Japanese Patent Laid-open Publication No. Hei. 9-222311 (and the corresponding U.S. Pat. No. 5,808,744), mark position detection devices for detecting alignment marks on a wafer as disclosed in, for example, Japanese Patent Laid-open Publication No. Hei. 10-281729, or sample surface scanning devices for examining for foreign bodies or blemishes on a wafer surface disclosed in, for example, Japanese Patent Laid-open Publication No. Hei. 10-281729, a target is sequentially photographed by moving the target and emitting a flash of light at the position of the target in a synchronized manner.

However, with the probe mark reading device of the related art disclosed in, for example, Japanese Patent Publication Laid-open No. Hei. 5-3230, it is necessary to carry out positioning by having a user move the semiconductor wafer mounted on a stage etc. so that probe marks formed on the electrode pads can be directly observed or photographed. However, in some cases there may be from a few tens of thousands to a few hundreds of thousands of probe marks on the wafer as a whole and reading the probe marks one at a time is both time-consuming and troublesome.

Moreover, devices for detecting a target different from an electrode pad, that move the target in the manner described above while taking a series of photographs also exist (for example, refer to Japanese Laid-open Publication No. Hei. 9-222311, Japanese Laid-open Patent Publication No. 10-281729, and Japanese Patent Publication No. Hei. 11-326233). According to these devices, photographing can take place in a short period of time without being troublesome to the user. However, with these devices, photographing is repeated at the same period and a photographing is carried out at a high-speed by making the picture-taking interval fixed. Therefore, as with electrode pads, the arrangement is unlikely to be at equal intervals, and it is not planned to take pictures at high speed of a target for which arrangement position may be changed (depending on the wafer). The above devices therefore cannot be easily used as devices for reading a multiplicity of probe marks formed at a multiplicity of electrode pads.

Further, in recent years, the number of times inspections are carried out is increasing with increases in the aspects of a chip that are tested electrically and with the complexity of test content. Cases where the position of a test probe is therefore shifted a little at a time to be parallel while tests are carried out to ensure that a hole is not made in an electrode pad of a thickness that is usually in the order of one micron are common. A plurality of probe marks are therefore formed on an electrode pad that has been subjected to a plurality of tests. It is therefore difficult to determine which of a plurality of probe marks is a probe mark formed by the final test. It is, however, possible to determine the position of the probe mark etc. from images photographed for the electrode pads by performing a difference operation in pixel units on an image for before the final test and an image for after the test. However, this kind of difference operation is extremely time consuming.

SUMMARY OF THE INVENTION

It is therefore an object of the present invention to provide a probe mark reading device and a probe mark reading method capable of reading probe marks without putting a user to a great deal of trouble and in a short period of time.

A further object of the present invention is to provide a probe mark reading device and probe mark reading method, and a probe mark test device and probe mark test method capable of rapidly determining positions etc. of probe marks based on images taken of electrode pads.

In order to achieve the aforementioned objects, the present invention has the features described below.

In one aspect of the present invention, a probe mark reading device for reading probe marks formed on electrode pads during checking of electrical characteristics of a prescribed object including a plurality of electrode pads comprises an illuminating unit for illuminating the electrode pads, a photographing unit for photographing the electrode pads illuminated by the illuminating unit and outputting images obtained by photographing as electrical signals;

a photographing position changing unit for consecutively changing a photographing position to be photographed by the photographing unit, and a storage unit for receiving the electrical signals from the photographing unit and saving the image obtained from the electrical signals, wherein an image of an electrode pad to be photographed is supplied to the photographing unit for just a prescribed time in the vicinity of the time when the electrode pad is to be photographed by the photographing unit.

According to this configuration, images can be obtained for all of the electrode pads as a result of the photographing position being consecutively changed by the photographing position changing unit and images of electrode pads to be photographed by the photographing unit being provided for just a short period of time in the vicinity of the time of photographing. With this configuration, it is possible to acquire images for electrode pads and read probe marks without putting a user to any trouble and in a short period of time.

With this kind of probe mark reading device, the photographing position changing unit may also change the photographing position at a predefined moving speed so as to enable photographing in order of images for all of the electrode pads in such a manner as to open up a time gap of photographing time required to acquire a single image in the case of consecutive photographing by the photographing unit or longer.

According to this configuration, photographing is carried out in order at a prescribed speed while opening up a time gap of the time required for photographing or more by the photographing position changing unit. It is also possible to move the photographing position at high speed. Moreover, it is possible to make the photographing conditions for each photographing position fixed when moving at a fixed speed.

With this probe mark reading device, an image of an electrode pad to be photographed by the photographing unit may be provided as a result of the illuminating unit being provided with a flash emitting a flash of light for just a prescribed period of time in the vicinity of the time where the electrode pad is photographed by the photographing unit.

According to this kind of configuration, it is possible to take pictures of the electrode pads in order using the photographing unit, with the electrode pads being lit up for just a short period of time by a burst of light from the illuminating unit. With this configuration, it is possible to ensure that the image does not blur and also that images can be captured with a device configuration that is straightforward and inexpensive compared with devices having physical shutters, etc.

This kind of probe mark reading device may also comprise a storage unit for storing layout information that is data relating to layout positions of the plurality of electrode pads, and a trigger unit for calculating a position for the electrode pad to be photographed by the photographing unit based on the layout information stored in the storage unit and enabling a photograph to be taken by the photographing unit when the photographing position coincides using the photographing position changing unit with the position the electrode pad is to be photographed at.

According to this configuration, as a result of calculating the photographing positions of all of the pads to be photographed based on layout information by the trigger unit, it is possible to read in a large number of probe marks formed at a large number of pads even if the electrode pads are not laid-out at equal intervals and/or the arrangement position on the semiconductor changes.

With this probe mark reading device, there is provided a probe mark checking unit for determining quality of prescribed probe marks included in the image based on the image stored in the storage unit, wherein the probe mark checking unit comprises an initial vector calculator for calculating an initial vector equivalent to a vector drawn from a position of a pre-registered model probe mark relating to a prescribed electrode pad selected from the plurality of electrode pads to a probe mark position formed on the prescribed electrode pad, and a probe mark quality determination unit for determining whether or not a probe mark formed on an electrode pad different to the prescribed electrode pad is detected within a prescribed determination range including a position in the direction and distance of the initial vector from the position of the pre-registered probe mark relating to the different electrode pad.

According to this configuration, an initial vector is calculated from a prescribed electrode pad selected from the plurality of electrodes, and the quality of the probe marks can be determined in probe mark checks for other electrode pads based on the initial vector and a prescribed determination range. It is therefore possible to determine the quality etc. of probe marks formed by a final electrical characteristic check at a high speed even in cases where a plurality of probe marks are included in the image taken for an electrode pad.

Further, there is the possibility of erroneous detections etc. occurring due to shifts at the time of acquisition of an image when detecting probe marks formed by a final electrical characteristic check using a difference operation in pixel units but according to this configuration, reliable probe mark checks can be carried out without being influenced by shifting at the time of image acquisition or changes in pixel luminance etc. because relative position detection is carried out based on an initial vector.

With this probe mark reading device, the probe mark checking unit may include a probe mark position determination unit for determining whether or not a probe mark overlaps with a prescribed region set for the vicinity of the edge of an electrode pad including the probe mark detected by the probe mark quality determination unit.

According to this configuration, since it is determined whether or not an area occupied by a probe mark overlaps with an area for a protective part (passivation part) normally formed in the vicinity of the edge of the electrode pad by making a determination, it is possible to determine using a probe mark position determining unit that problems such as conduction defects may occur in electrical characteristic checks when these areas overlap.

With this probe mark reading device, the probe mark checking unit may further comprise a classification header generator for generating classification header information including information identifying each electrode pad included in the object and determination results of the probe mark quality determination unit and storing the classification header information correlating corresponding electrode pad images in the storage unit.

According to this configuration, images of electrode pads to be checked can be efficiently designated and read out from a storage unit during detailed checks carried out afterwards using the classification header information that is created.

With this probe mark reading device, the initial vector calculator may comprise a detector for detecting probe marks formed by the electrical characteristic check by performing a difference operation on the images saved in the storage unit and images for the prescribed electrode pads taken in advance before checking the electrical characteristics, and a calculator for calculating an initial vector equivalent to the vector from the position of the probe mark taken as the pre-registered model correlating to the prescribed electrode pad to the position of the probe mark detected by the detector.

According to this configuration, a time-consuming image difference operation is only carried out when calculating the initial vector, with probe mark quality being determined based on the initial vector and the prescribed determination range in probe mark checks other than this. It is therefore possible to determine the quality etc. of probe marks formed by a final electrical characteristic check at a high speed even in cases where a plurality of probe marks are included in the image taken for an electrode pad.

With this probe mark reading device, the initial vector calculator calculates the initial vector based on the vector from the position of the probe mark that is the pre-registered model correlating to each of the electrode pads for four electrodes positioned in the vicinity of the corners of the object to the position of the probe mark formed on each of the electrode pads, and the probe mark quality determination unit determines whether or not a probe mark formed on an electrode pad different to the prescribed four electrode pads is detected within a prescribed determination range including a position in the direction and distance of the initial vector from the position of the pre-registered probe mark relating to the different electrode pad.

According to this configuration, because the initial vector is calculated by taking note of four electrode pads positioned in the vicinity of the corners of the object (for example, a semiconductor chip), slight shifts that may occur in the X or Y directions or in the direction of rotation during mounting of the object can be sufficiently and reliably averaged and probe mark quality etc. can be determined at high speed because the initial vector is calculated using a small number of electrode pads.

In a further aspect of the present invention, a probe mark test device for checking probe marks formed on electrode pads during checking of electrical characteristics of a prescribed object including a plurality of electrode pads comprises an initial vector calculator for calculating an initial vector equivalent to a vector drawn from a position of a pre-registered model probe mark relating to a prescribed electrode pad selected from the plurality of electrode pads to a position of a probe mark included in an image for the electrode pad obtained by photographing the electrode pad, and a probe mark quality determination unit for determining whether or not a probe mark formed on an electrode pad different to the prescribed electrode pad is detected within a prescribed determination range including a position in the direction and distance of the initial vector from the position of the pre-registered probe mark relating to the different electrode pad.

According to this configuration, the difference with the aforementioned aspect of the present invention is that a photographing unit etc. is not assumed, but, as with the above configuration, it is still possible to determine the quality etc. of probe marks formed by a final electrical characteristic check at a high speed even in cases where a plurality of probe marks are included in an image taken in advance for an electrode pad. Further, there is the possibility of erroneous detections etc. occurring due to shifts at the time of acquisition of an image when detecting probe marks formed by a final electrical characteristic check using a difference operation in pixel units, but according to this configuration, reliable probe mark checks can be carried out without being influenced by shifting at the time of image acquisition or changes in pixel luminance etc. because relative position detection is carried out based on an initial vector.

In a still further aspect of the present invention, a probe mark reading method for reading probe marks formed on electrode pads during checking of electrical characteristics of a prescribed object including a plurality of electrode pads comprises an illuminating step of illuminating the electrode pads, a photographing step of photographing the electrode pads illuminated in the illuminating step and outputting images obtained by photographing as electrical signals, an image position changing step of consecutively changing a photographing position to be photographed in the photographing step, and a storage step of receiving the electrical signals outputted in the photographing step and saving images obtained from the electrical signals, wherein an image of an electrode pad to be photographed in the photographing step is supplied for just a prescribed time in the vicinity of the time when the electrode pad is to be photographed in the photographing step.

In another aspect of the present invention, a probe mark test method for checking probe marks formed on electrode pads during checking of electrical characteristics of a prescribed object including a plurality of electrode pads comprises an initial vector calculating step of calculating an initial vector equivalent to a vector drawn from a position of a pre-registered model probe mark relating to a prescribed electrode pad selected from the plurality of electrode pads to a position of a probe mark including an image for the electrode pad obtained by photographing the electrode pad, and a probe mark quality determination step of determining whether or not a probe mark formed on an electrode pad different to the prescribed electrode pad is detected within a prescribed determination range including a position in the direction and distance of the initial vector from the position of the pre-registered probe mark relating to the different electrode pad.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

The following is a detailed description, with reference to the appended drawings, of a preferred embodiment of the present invention.

1. Overall Configuration

Figure 1:
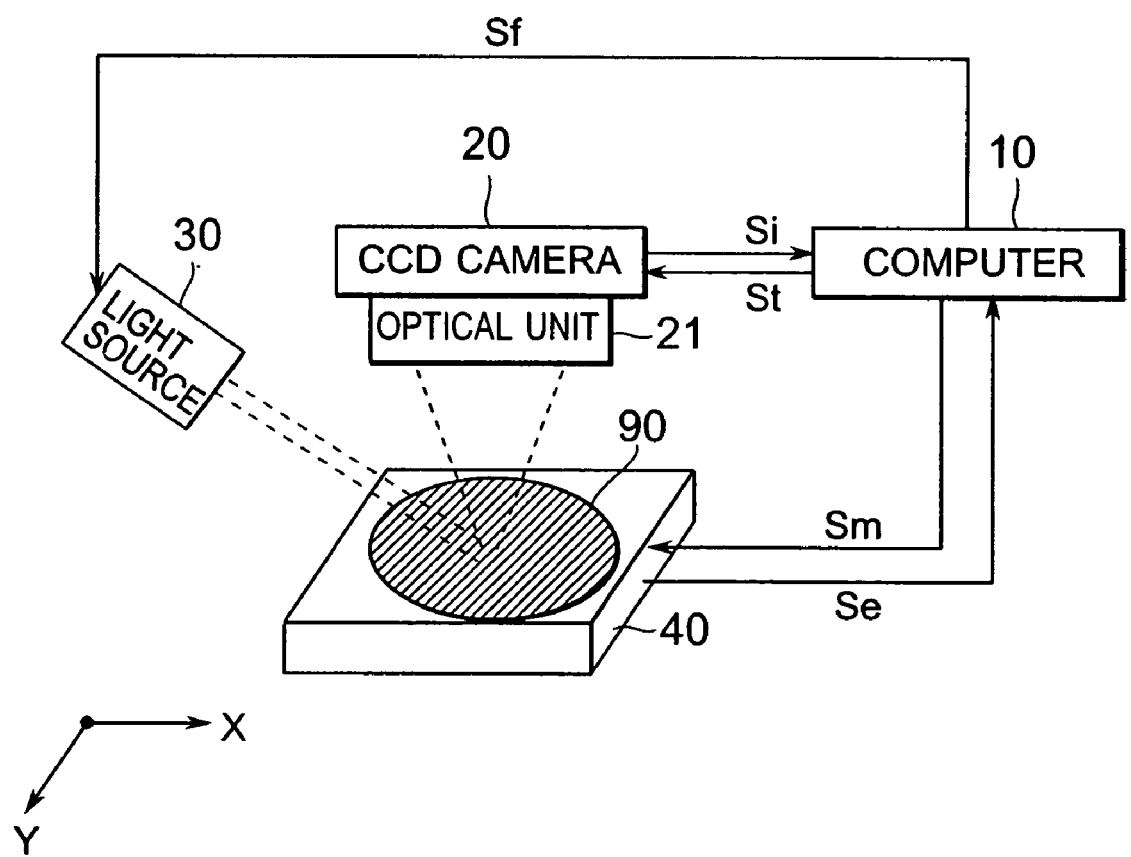
FIG. 1 is a block view showing a configuration for a probe mark reading device of an embodiment of the present invention.

FIG. 1 is a block view showing a configuration for a probe mark reading device of an embodiment of the present invention. The probe mark reading device for reading probe marks formed on electrode pads of semiconductor chips contained on a semiconductor wafer 90 comprises a CCD camera 20 for taking images of the semiconductor wafer 90, an optical unit 21 for optically enlarging an image of a location to be photographed by the CCD camera 20, a light source 30 for illuminating the location to be photographed by the CCD camera 20, an X-Y stage 40 including a mounting table mounted with the semiconductor wafer 90 and being capable of changing a position to be photographed by the CCD camera 20 by moving the mounting table in an X-direction and a Y-direction, and a computer 10 for controlling the above. It is taken that there is no light source other than the light source 30.

The CCD camera 20 is fixed at a prescribed position above the X-Y stage 40 mounted with the semiconductor wafer 90 and takes images of prescribed portions of the semiconductor wafer 90 enlarged by the optical unit 21, i.e. images of the vicinity of prescribed electrode pads, a plurality of which are contained on the semiconductor chip within the semiconductor wafer 90, as two-dimensional images based on a trigger signal St from the computer 10, with two-dimensional images obtained as a result of this photographing being outputted as an image signal Si. Specifically, the CDD camera 20 takes a picture by opening a shutter built-into the CDD camera 20 at the time when a trigger signal St is provided, and then closing the shutter after a flash of light is emitted by the light source 30 (described later). The CCD camera 20 is an imaging device utilizing a monochrome or color Charge-Coupled Device (CCD) as an image sensor. However, it is also possible to use sensing devices utilizing Metal Oxide Semiconductors (MOS) or imaging devices having other photoelectric conversion functions.

The optical unit 21 forms an optically enlarged (enlarged by ten to twenty times in this case) image of a prescribed portion of the semiconductor wafer 90 at the CCD camera 20 using one or more built-in lenses. The optical unit 21 may be omitted if the resolution of the CCD camera 20 is sufficiently high.

The light source 30 is fixed at a prescribed position above the semiconductor wafer 90 and is a xenon flash lamp for illuminating the prescribed portion to be photographed by the CCD camera 20. The light source 30 lights up the prescribed portion by generating a high-intensity burst of light for just a short time of a few microseconds from the time of being provided with a flash signal Sf outputted directly after the trigger signal St is outputted from the computer 10. The time for which the burst lights up is extremely short compared to the usual shutter speed of a camera (a few milliseconds) but this is in order to prevent an image obtained through photographing from becoming blurred due to movement of the semiconductor wafer 90 that is the subject being photographed. The lighting up by the high-intensity light source 30 is in order to obtain the amount of light necessary to take a picture with the CCD camera 20 in a short period of time. The light source 30 may therefore simply be a light source capable of releasing high-intensity light for a short period of time, and may also be, for example, and LED or laser light source. The time from the trigger signal St being outputted to the flash signal Sf being outputted is short enough to be ignored and in the following it is taken that these signals are outputted at substantially the same time. Specifically, the flash signal Sf can be generated by inputting the trigger signal St to a delay circuit having an extremely short delay time.

The semiconductor wafer 90 is mounted on a moveable mounting table provided on the upper side of the X-Y stage 40. The X-Y stage 40 also includes a motor (for example, a stepping motor, servo motor, or linear motor, etc.) for moving the mounting table in an X-direction and a Y-direction, and an encoder (for example, various types of motor encoder or linear scales) for determining distances the mounting table moves in the X-direction and the Y-direction. The motor included at the X-Y stage 40 is controlled based on a motor control signal Sm from the computer 10 and is driven so as to move the mounting table to a prescribed position. Further, the encoder contained at the X-Y stage 40 outputs an encoder signal Se including an X-Encoder Pulse (hereafter abbreviated to "X pulse signal") that is a pulse signal generated every time the mounting table moves a unit distance in the X-direction, a Y-Up Pulse (hereafter abbreviated to "Y pulse signal") that is a pulse signal generated every time the mounting table moves a unit distance in the Y direction, an X-reset (hereinafter referred to as "X reset signal") that is a signal generated when the mounting table is positioned on the X-axis at a reference position in the X-direction, and a Y-reset (hereinafter referred to as "Y reset signal") that is a signal generated when the mounting table is positioned on the Y-axis at a reference position in the Y-direction.

Figure 2:
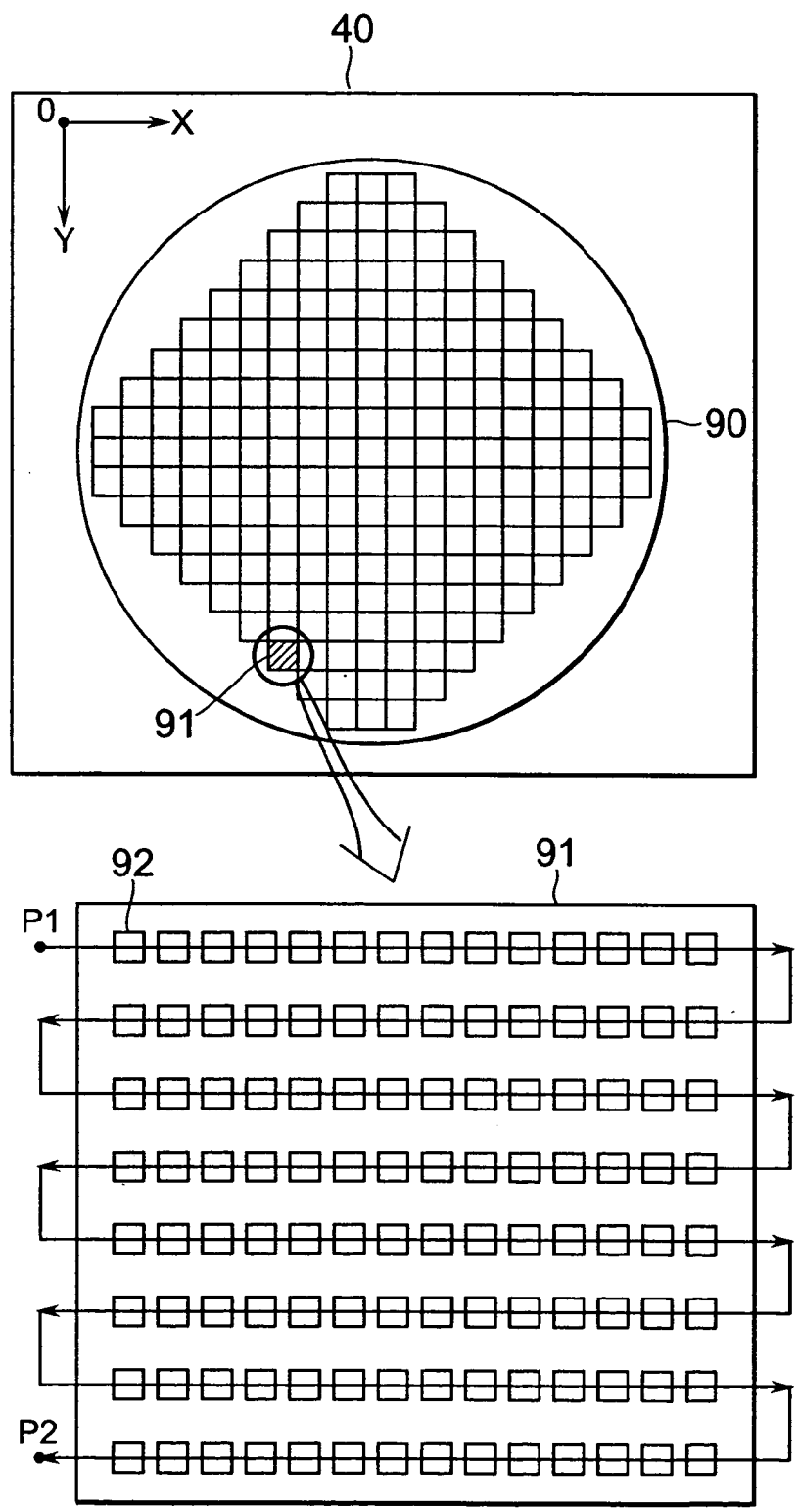
FIG. 2 is a view illustrating a photographing operation of the embodiment.

This probe mark reading device moves the semiconductor wafer 90 mounted on the mounting table in the X-direction at a fixed speed using the X-Y stage 40, with pictures being taken using the CCD camera 20 in order of the electrode pads lit up at prescribed timings by bursts of light from the light source 30. All of the electrode pads included in the semiconductor chips on the semiconductor wafer 90 are photographed by moving the semiconductor wafer 90 a prescribed distance in the Y direction (i.e. one line portion) every time a photographing operation in the X-direction finishes and repeating the photographing operation in the X-direction. FIG. 2 is a view illustrating this kind of photographing operation.

The view in the upper half of FIG. 2 is an outline view showing the positional relationship of the (mounting table of the) X-Y stage 40 and the semiconductor wafer 90. An X-Y coordinate system and origin are shown in the upper left of FIG. 2 and these are the X-Y coordinate system and origin for the X-Y stage 40. Further, the position of the CCD camera 20 is set with respect to the X-Y stage 40 in such a manner that the X-Y coordinate system becomes the same as the coordinate system for images obtained by photographing with the CCD camera 20 and in such a manner that the origin position becomes the same as the central position (hereafter referred to as "photographing position") of images obtained by taking pictures.

The view shown in the lower half of FIG. 2 is a view showing a locus for the photographing position when electrode pads 92 within semiconductor chips 91 contained in the semiconductor wafer 90 are photographed using the CCD camera 20. P1 in FIG. 2 shows the photographing position (hereafter referred to as "start position") when the photographing operation is started and P2 in FIG. 2 shows the photographing position (hereafter referred to as "end position") when the photographing operation is finished. The CCD camera 20 takes pictures of the electrode pads 92 arranged (in rows) in the X-direction from the start position P1 in order at prescribed timings as a result of movement of the mounting table included at the X-Y stage 40 in the negative X-direction. When the photographing position exceeds the right end side of the semiconductor chip 91, the electrode pads 92 to be photographed are moved one line portion in the Y-direction by moving the mounting table included in the X-Y stage 40 in the negative Y-direction. The electrode pads 92 arranged in the negative X-direction are therefore photographed similarly in order at prescribed timings by moving the mounting table included in the X-Y stage 40 in the X-direction. The photographing position then reaches the end position P2 by repeating the above photographing operation so that all of the electrode pads 92 within the semiconductor chips 91 are photographed. This photographing operation is carried out for all of the semiconductor chips. The above photographing operation is controlled by the computer 10. The configuration of the computer 10 and the photographing operation are described below.

2. Computer Configuration and Photographing Operation

Figure 3:
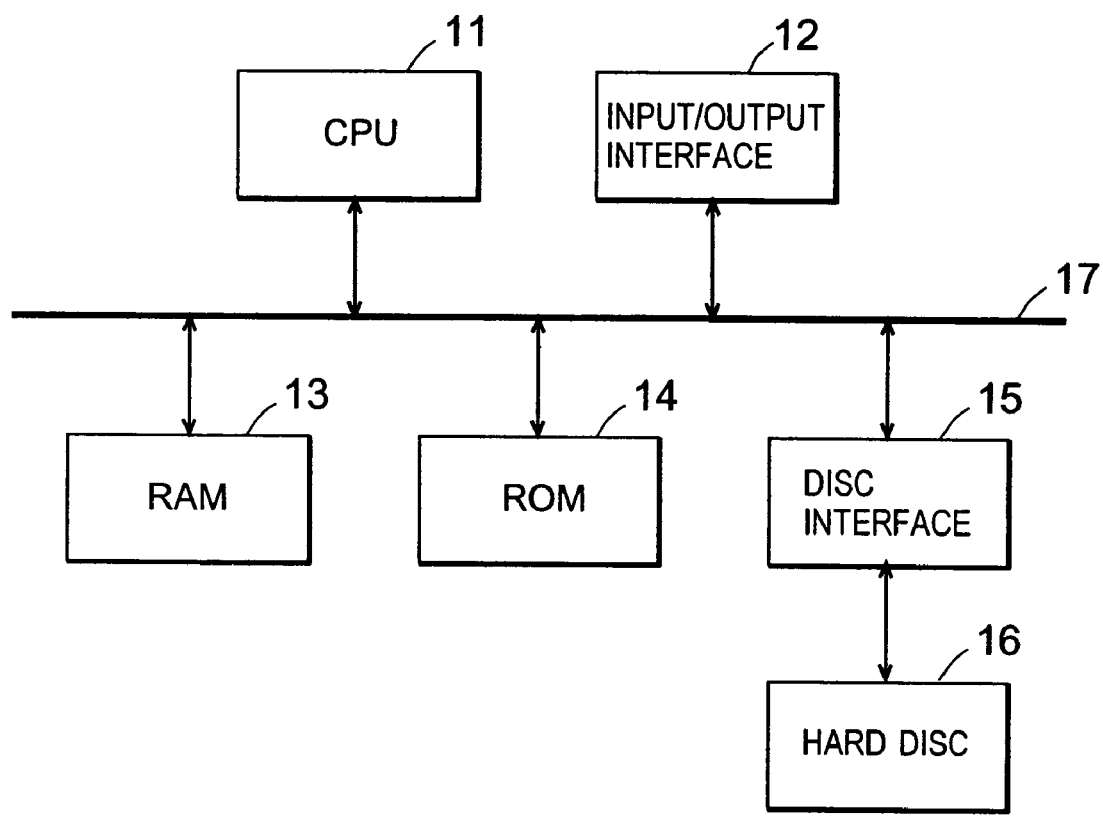
FIG. 3 is a block view showing an outline of a configuration for a computer of the embodiment.

This computer 10 is a typical computer system such as, for example, a personal computer or work station, etc. FIG. 3 is a block view showing an outline of a configuration for the computer 10 of the embodiment. The computer 10 is comprised of a CPU (Central Processing Unit) 11 for carrying out various processing operations, an input output interface 12 for connecting input devices such as an external keyboard and mouse etc. and display devices such as LCDs or CRTs etc. to an internal bus 17, RAM (Random Access Memory) 13 for temporarily storing data and programs, ROM (Read Only Memory) 14 for pre-storing prescribed programs etc., a hard disc 16 serving as a large capacity storage device, and a disc interface 15 for connecting the hard disc 16 to the internal bus 17.

Further, by executing prescribed programs stored in RAM 13 from external storage media such as CD-ROMs or communication lines via the input output interface 12 etc., the computer 10 executes processing to receive image signals Si from the CDD camera 20, provide a trigger signal St to the CCD camera 20, provide a flash signal Sf to the light source 30, receive an encode signal Se from the X-Y stage 40, and provide a motor control signal Sm to the X-Y stage 40. The following is a description with reference to the drawings of each function configuration and photographing operation of the computer 10 including these software processes.

Figure 4:
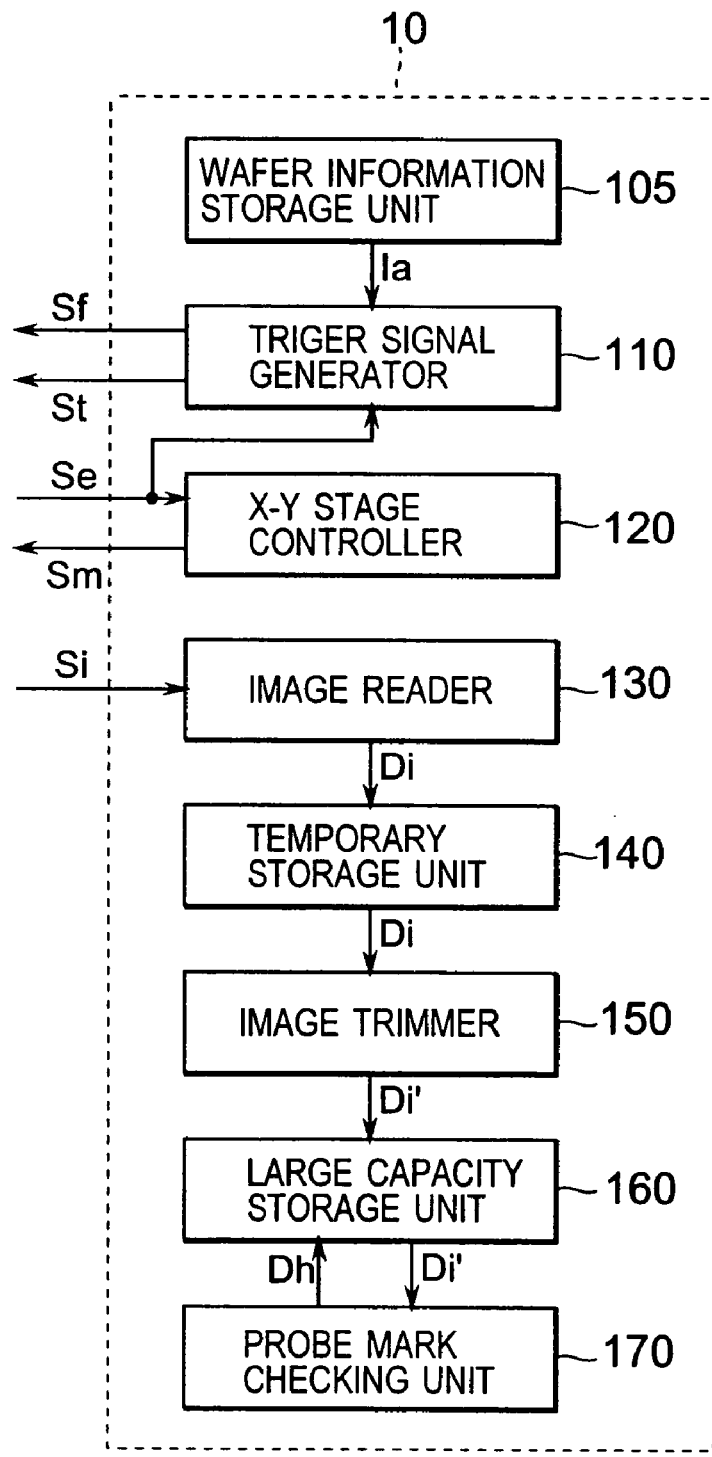
FIG. 4 is a block view showing the configuration of functions of a computer of the embodiment.

FIG. 4 is a block view showing a configuration for functions of the computer 10. This computer 10 is comprised of a trigger signal generator 110 for receiving the encoder signal Se and outputting the trigger signal St and the flash signal Sf at prescribed timings, an X-Y stage controller 120 for receiving the encode signal Se and outputting the motor control signal Sm, an image reader 130 for receiving the image signal Si, a temporary storage unit 140 for temporarily storing image data Di, an image trimmer 150 for performing prescribed trimming processing on the image data Di, a large capacity storage unit 160 for saving trimmed image data Di' in order to perform probe mark checks afterwards, and a probe mark checking unit 170 for checking probe marks based on image data Di' stored in the large capacity storage unit 160. The probe mark checking unit 170 carries out probe mark checking after the photographing operation described below, but this operation is described later.

The trigger signal generator 110 writes prescribed data to a prescribed address of the RAM 13 in advance and outputs the trigger signal St and the flash signal Sf at a prescribed timing based on the encoder signal Se. The following is a description of the operation with reference to FIG. 5.

Figure 5:
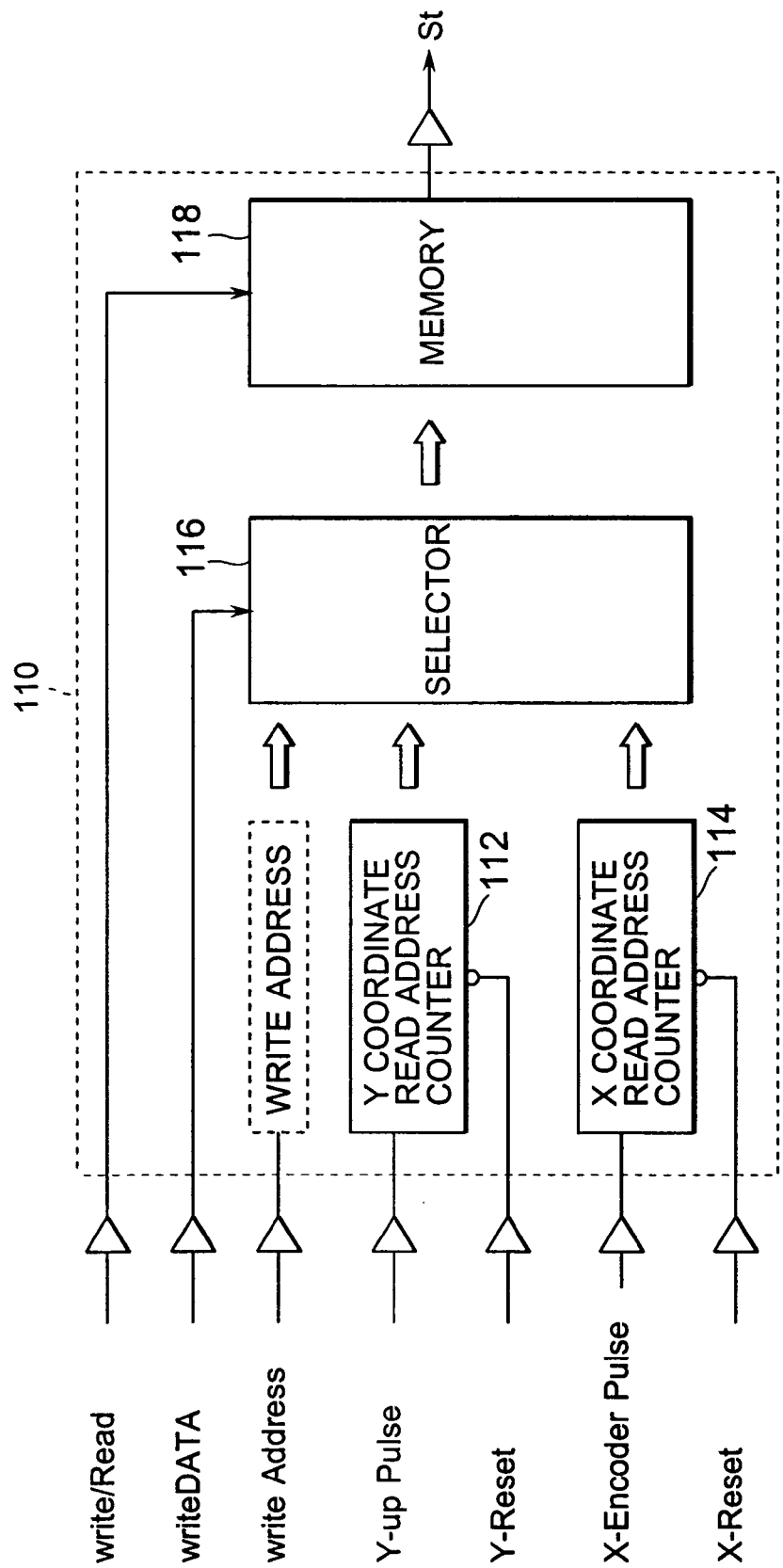
FIG. 5 is a view illustrating an operation for generating a trigger signal St of the embodiment.

FIG. 5 is a view illustrating an operation for generating the trigger signal St. The trigger signal generator 110 shown in FIG. 5 is equipped with a Y-coordinate read address counter 112, an X-coordinate read address counter 114, a selector 116, and memory 118, as functional structural elements relating to generation of the trigger signal St. The Y-coordinate read address counter 112 counts a pulse expressing the Y-pulse signal (Y-Up Pulse) and outputs the count value as a memory address signal (Y-coordinate address signal) corresponding to the Y-coordinate, and when a Y-reset signal (Y-Reset) is inputted, the count value is forcibly set as an address value corresponding to a prescribed Y-coordinate corresponding to the reference position in the Y-direction. The X-coordinate read address counter 114 counts a pulse expressing the X-pulse signal (X-Encoder Pulse) and outputs the count value as a memory address signal (X-coordinate address signal) corresponding to the X-coordinate, and when an X-reset signal (X-Reset) is inputted, the count value is forcibly set as an address value corresponding to a prescribed X-coordinate corresponding to the reference position in the X-direction. The Y-coordinate address signal and the X-coordinate address signal outputted from the Y-coordinate read address counter 112 and the X-coordinate read address counter 114 are inputted to the selector 116. A signal (hereafter referred to as "write address signal") expressing a write address (write Address) corresponding to a coordinate corresponding to the center of an electrode pad and data (hereafter referred to as "write DATA")to be written to the write address are inputted to the selector 116. The selector 116 selects one of two types of address signal from the write address signal and a read address signal comprised of a Y-coordinate address signal and an X-coordinate address signal and provides the selected address signal to memory 118. When the write address signal is selected at this time, the write data is also supplied to the memory 118 and the write data is written to an address expressed this write address signal at the memory 118. On the other hand, when the read address signal is selected, data at an address expressed by this read address signal is read from the memory 118 and outputted from the trigger signal generator 110 as the trigger signal St.

The trigger signal generator 110 having the above construction receives layout information Ia (for example, coordinate information etc. expressing the position of each electrode pad 92 in a prescribed coordinate system set with respect to the semiconductor chip 91) relating to the layout of the semiconductor chips 91 included at the semiconductor wafer 90 and the layout of the electrode pads 92 from a wafer information storage unit 105 for storing information relating to the semiconductor wafer 90 provided externally to this probe mark reading device and calculates coordinates (hereafter referred to as "center coordinates of pads") corresponding to central positions of all of the electrode pads 92 to be taken as photographing targets included in the semiconductor chip 91 based on this layout information Ia. The calculated coordinates are converted to respective corresponding memory addresses, and data (in this case "1") expressing the presence of a central coordinate for a pad is written to the address in the memory 118. Specifically, as described above, the memory address is input to the selector 116 as a write address (Write Address), and write data (Write Data) of "1" is inputted to the selector 116. The selector 116 writes "1" to a corresponding address of the memory 118. The memory address is set to uniquely correspond to the X-coordinate. A straight line linking central coordinates of each electrode 92 in the X-direction coincides with a straight line linking photographing positions in the X-direction, and an X-coordinate of a photographing position can therefore be specified by specifying the memory address.

Figure 6:
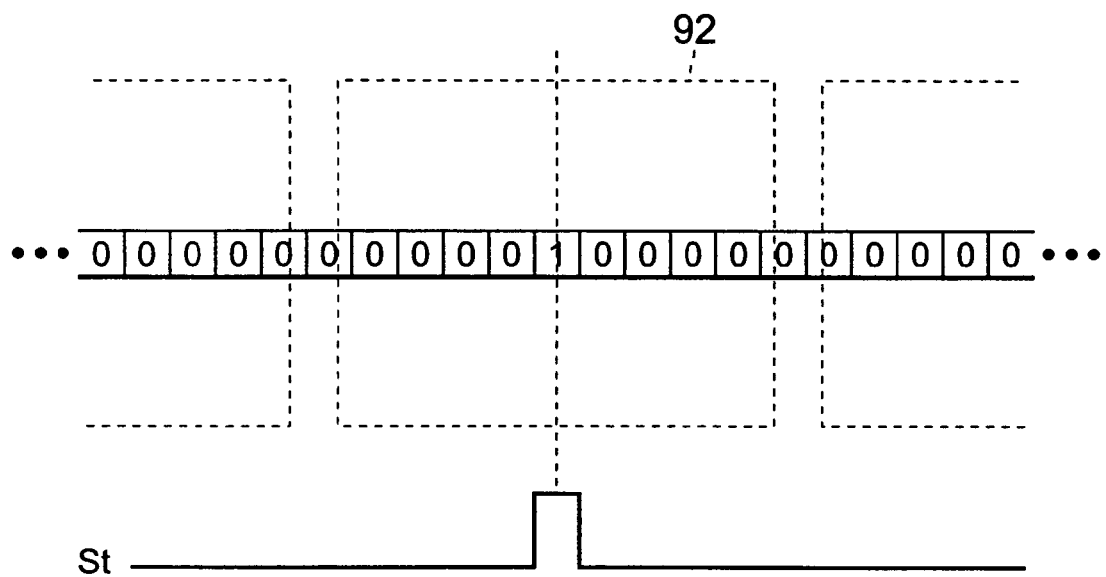
FIG. 6 is a schematic view illustrating a relationship between photographing position and memory address of the embodiment.

FIG. 6 is a schematic view illustrating a relationship between this kind of photographing position and memory address. A square frame laid out along a straight line linking the central coordinates of the electrode pad 92 shown in FIG. 6 in the X-direction represents a memory address, with numeric characters within the frame expressing data written to the memory address. In FIG. 6, "1" is written to an address corresponding to the central coordinate of the pad, and the trigger signal generator 110 outputs a trigger signal St when the photographing position coincides with a position corresponding to this address.

Specifically, as shown in FIG. 5, a prescribed memory address corresponding to a Y-coordinate is set by the Y-coordinate read address counter 112 every time a Y-pulse signal included in the encoder signal Se from the X-Y stage 40 is inputted and is supplied to the selector 116. Further, when an X-reset signal is inputted, a prescribed memory address corresponding to the X-axis is set. Further, when the Y-reset signal is inputted, reading from the first position of the memory address is started. Moreover, the memory address is incremented by the X-coordinate read address counter 114 every time the X-pulse signal is inputted, data is read in order from the memory address by the selector 116, and a trigger signal St is immediately output when a "1" is read. The electrode pad 92 is then photographed when the central coordinate of the pad coincides with the photographing position.

Strictly speaking, the time of photographing is the time that the flash signal Sf is outputted directly after outputting of the trigger signal St but both are substantially the same time and in reality there is no difference. As shown in FIG. 2, all straight lines linking the central positions of each electrode pad 92 in the Y-direction is taken to be parallel to the Y-axis. Namely, the layout pattern in the X-direction for each of the electrode pads 92 is taken to repeat in the Y-direction.

The X-Y stage controller 120 receives the encoder signal Se indicating the position of the mounting table of the X-Y stage 40 on which the semiconductor wafer 90 is mounted, generates a prescribed motor control Signal Sm for moving the mounting stage to the prescribed position, and provides this motor control signal Sm to the X-Y stage 40. Specifically, as described above for the view shown in the lower half of FIG. 2, feedback control is carried out in such a manner as to move the mounting table of the X-Y stage 40 so that the photographing position traces the locus shown by the arrow in FIG. 2 during photographing by the CCD camera 20. This moving speed is a fixed speed and decided in such a manner as to move the photographing position from the center position of a certain electrode pad to the center position of an electrode pad adjacent in the X-direction to the certain pad in the same amount of time or longer as the time (hereafter referred to as photographing time) required to acquire a single image when acquiring images consecutively in order using the CCD camera 20. If movement is achieved within a time shorter than the photographing time, then it is no longer possible to photograph (the central positions of) all of the electrode pads. The photographing time is in the order of, for example, 30 milliseconds. Further, it is not necessary for the moving speed to be fixed, but when the moving speed is fixed, it is preferable for the photographing conditions at each photographing position to be fixed.

The image reader 130 receives the image signal Si obtained by the CCD camera 20 and generates and outputs image data Di that is an image photographed for the electrode pad and the vicinity of the electrode pad from this image signal Si. This image data Di is temporarily stored in a prescribed area of the RAM 13 by the temporary storage unit 140.

The image trimmer 150 generates trimmed image data Di' by performing trimming on the image data Di stored by the temporary storage unit 140 so as to delete prescribed areas of the photographed image to the outside of the vicinity of the electrode pad 92.

Figure 7:
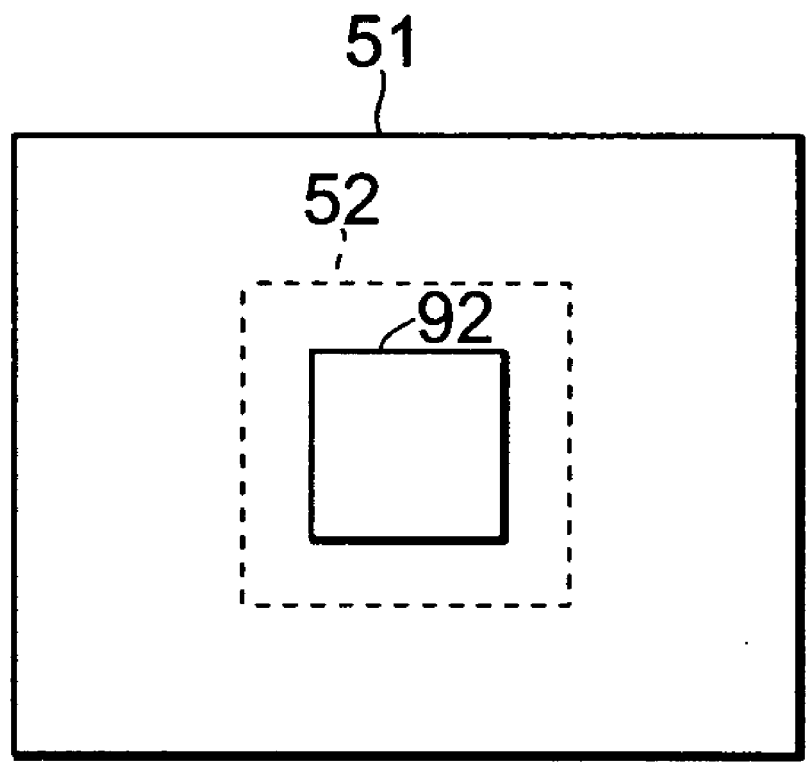
FIG. 7 is a schematic view illustrating trimming processing of the embodiment.

FIG. 7 is a schematic view illustrating this trimming processing. An image 51 in FIG. 7 corresponds to the image data Di and the central coordinate of the electrode pad 92 coincides with the photographing position. Further, a trimming boundary line 52 shown by the dashed line in FIG. 7 includes the image photographed for the electrode pad 92 and is set as a boundary line encompassing a region slightly larger than the periphery of the electrode pad 92. A central position of the region within the trimming boundary line 52 is set to coincide with the central coordinate of the electrode pad 92. It is therefore straightforward to set the trimming boundary line 52 with respect to the image 51. Trimmed image data Di' is therefore easily created from an image taken for the electrode pad 92 within the trimming boundary line 52 without it being necessary to perform trimming processing by recognizing the image taken for the electrode pad 92 using well-known image recognition processing methods. The trimmed image data Di' is saved to the hard disc 16 by the large capacity storage unit 160 via the disc interface 15. The image data Di' saved by the large capacity storage unit 160 is then taken as the subject of probe mark checking by the probe mark checking unit 170. The following is a description with reference to the drawings of a processing procedure relating to the operation for photographing of the computer 10 corresponding to the above functions.

Figure 8:
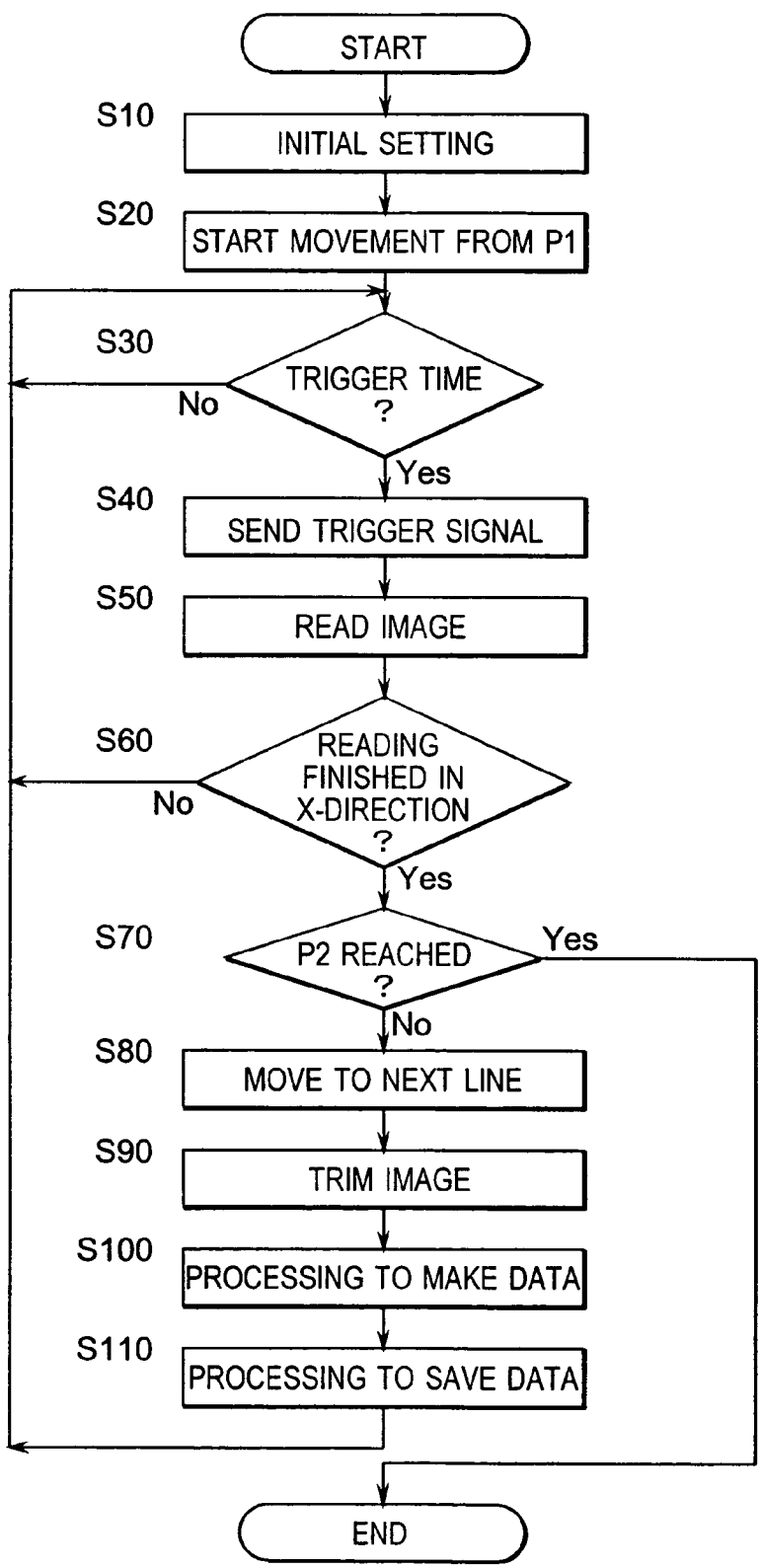
FIG. 8 is a flowchart showing the processing procedure relating to a photographing operation for the computer of the embodiment.

FIG. 8 is a flowchart showing the processing procedure relating to a photographing operation for the computer 10. The trigger signal generator 110 that is a function of the computer 10 carries out initial setting processing to receive layout information Ia relating to the layout of the semiconductor chips 91 included at the semiconductor wafer 90 and the layout of the electrode pads 92 etc. from the wafer information storage unit 105, calculate center coordinates for all of the electrode pads 92 included in the semiconductor chip 91, convert the calculated coordinates into corresponding memory addresses, and write data "1" indicating the presence of a central coordinate of a pad in the memory address (step S10). Center coordinates for all of the electrode pads 92 included in all of the semiconductor chips may then be calculated and written to corresponding memory addresses.

Next, the X-Y stage controller 120 generates a prescribed motor control signal Sm in order to move the position of the mounting table of the X-Y stage 40 on which the semiconductor wafer 90 is mounted in order to align the photographing position of the CCD camera 20 with a prescribed start position P1 and provides this motor control signal Sm to the X-Y stage 40. Further, when the photographing position of the CCD camera 20 is aligned with the prescribed start position P1, the prescribed motor control signal Sm is provided to the X-Y stage 40 in order to move the mounting table at the fixed aforementioned speed of movement in the X-direction based on the consecutively received encoder signals Se expressing the position of the mounting table (step S20).

Next, the trigger signal generator 110 determines whether or not the center coordinate of the pad coincides with the photographing position based on the encoder signal Se (step S30). When there is no coincidence, the determination of step S30 is repeated. When there is coincidence, the trigger signal generator 110 outputs a trigger signal St (step S40). Outputting of the flash signal Sf directly after outputting of the trigger signal St is then as described above.

Next, the image reader 130 receives the image signal Si obtained by the CCD camera 20, generates image data Di that is an image photographed for the electrode pad and the vicinity of the electrode pad from this image signal S, and the temporary storage unit 140 temporarily stores this image data Di (step S50).

Next, the X-Y stage controller 120 makes a determination as to whether or not image reading in the X-direction is complete due to the photographing position of the CCD camera 20 exceeding the center coordinate of the electrode pad 92 at the furthermost end based on the encoder signal Se (step S60). If this is not the case, the processing returns to step S30, the process of sending a trigger signal at the time of a trigger is repeated until the image reading in the X-direction is complete (step S60→S30→S40→S50→S60). When image reading in the X-direction is complete, a determination is made as to whether or not the photographing position has reached the end position P2 (step S70). When image reading in the X-direction is not complete, step S30 is returned to after carrying out a process from step S80 to S110 described below, and the process is repeated until the photographing position reaches the end position P2 (S70→S80→S90→S100→S110→S30→S40→S50→S60→S70). A description is now given of the process from S80 to S110.

When a determination is made in the process in step S70 that the photographing position has not reached the end position P2, the X-Y stage controller 120 generates a prescribed motor control signal Sm and provides this signal to the X-Y stage 40 in order to move the position of the mounting table of the X-Y stage 40 mounted with the semiconductor wafer 90 so that the photographing position of the CDD camera 20 lines up with the Y-coordinate corresponding to the line for the following electrode pad (step S80).

Next, the image trimmer 150 generates trimmed image data Di' by performing trimming on the image data Di stored by the temporary storage unit 140 so as to cut-out prescribed areas other than the area including the image photographed for the electrode pad 92 (step S90). This trimming process is carried out collectively for all of the image data Di (specifically, images taken for all of the electrode pads 92 laid-out in the X-direction) stored by the temporary storage unit 140.

Next, the image trimmer 150 creates data for the trimmed image data Di' that is added with supplemental information including prescribed numbers and comments utilized by the probe mark checking unit 170 when checking probe marks (step S100). Further, the large capacity storage unit 160 stores the data with the supplemental information added by the image trimmer 150 (step S110). After this, the above processing returns to step S30 and the processing is repeated until the photographing position reaches the end position P2.

The processing from steps S90 to S110 can be carried out using the moving time for moving the position of the mounting table of the X-Y stage 40 in the processing of step S80. When the processing speed of the computer 10 and the storing speed of the hard disc 16 are sufficiently fast, a configuration can be adopted where these processes are carried out immediately after the image capture processing of step S50. These processes may also be carried out concurrently with the processing of step S80 (and processes executed thereafter).

When it is determined in step S60 that the photographing position has reached the end position P2, the image capture operation for the semiconductor chip is complete. Further, when there is a semiconductor chip for which images are to be read-in present, the above processing is started from the beginning after completion of the probe mark checking operation described in the following.

3. Computer Probe Mark Checking Operation

Next, a description is given with reference to the drawings of a processing procedure relating to the operation for checking probe marks of the computer 10. An image taken of an electrode pad including a probe mark taken as a model and an image taken of an electrode pad 92 included the semiconductor chip 91 before forming a probe mark formed by checking electrical characteristics (hereinafter referred to as "probe test") on the subject to be checked for probe marks are necessary in the operation for checking for probe marks. A description is now given for the overall processing procedure including the probe mark checking operation.

Figure 11:
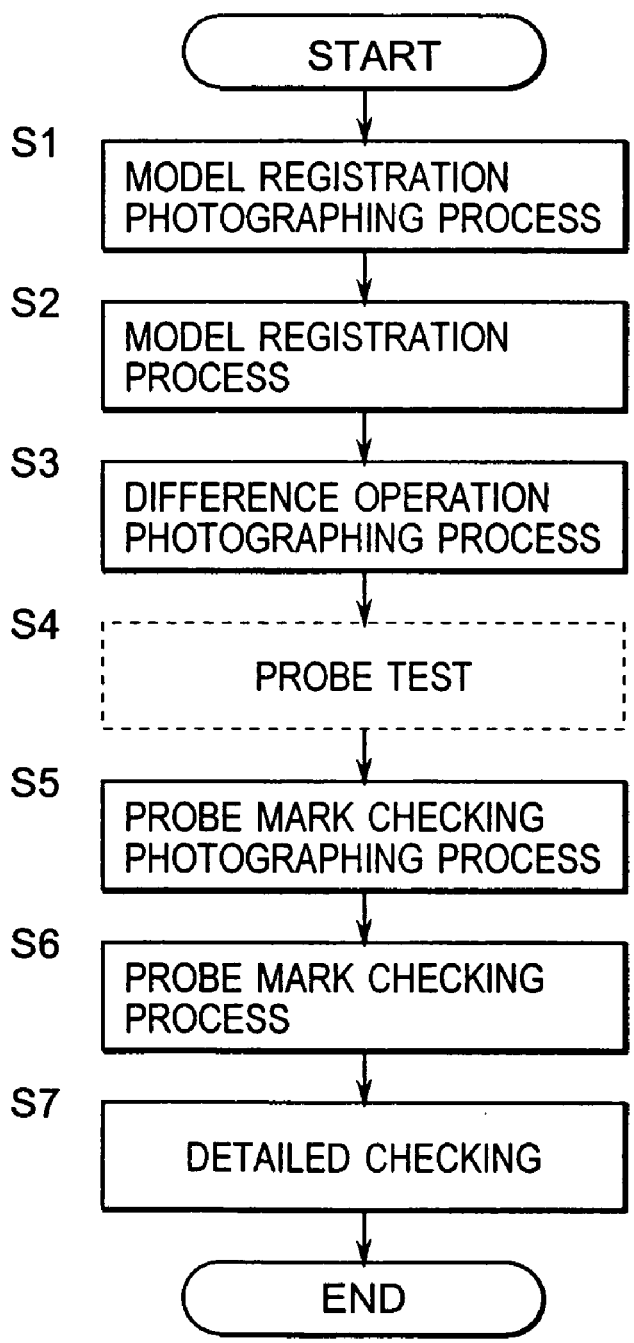
FIG. 11 is a flowchart showing an overall processing procedure when carrying out probe mark checking in this embodiment.

FIG. 11 is a flowchart showing the overall processing procedure when carrying out probe mark checking in this embodiment. In step S1, photographing (image processing for model registration) is carried out in order to register probe marks as models formed under ideal conditions on all of the electrode pads included at a prescribed semiconductor chip. Specifically, when the subject to be checked for probe marks is as yet not influenced in any way by the prescribed test probe (for example, in the case of a new product), in order to make the position of a newly formed probe mark clear, a probe mark is formed using a prescribed test probe on a dummy wafer that as yet has no probe marks, or on a new chip. The positions etc. of probe marks formed in this manner are therefore substantially ideal with no abnormalities. Processing is then carried out in order to use all of the images for the electrode pads formed with probe marks in this way in the following probe mark check operation. This photographing operation is exactly the same as the photographing operation described above with reference to FIG. 8 etc. and description thereof is therefore omitted.

In step S2, processing (model registration processing) is carried out to calculate and save barycentric coordinates for probe marks constituting the model by analyzing the images for the electrode pads including the probe marks constituting the models obtained by image processing for model registration (step S1). Publicly known methods are used to calculate barycentric coordinates using this kind of image analysis. For example, the region occupied by the probe mark included in the image or the pixels constituting the boundary are detected based on luminance of the pixels and the barycentric coordinates of the probe marks are calculated based on the coordinates of the pixels. The barycentric coordinates are coordinates in a prescribed coordinate system preset with respect to the semiconductor chip 91. The manner in which layout information Ia including in the information relating to this coordinate system is stored in the wafer information storage unit 105 is described above. The barycentric coordinates are calculated for all of the probe marks and are stored in the large capacity storage unit 160 together with information such as prescribed numbers utilized at the time of probe-mark checking due to the probe mark checking unit 170. In the following, various calculations are carried out based on barycentric coordinates for the probe marks but coordinates for characteristic points expressing included properties that are common to all of the probe marks (such as, for example, minimum Y-coordinate image coordinates, etc.) may also be used in place of the barycentric coordinates.

Information obtained through the processing of step S1 and step S2 can be used repeatedly until the prescribed test probe exhibits abnormality. To this end, it will suffice to carry out these processes once the test probe has been used, etc. In cases where it is possible that the prescribed test probe will be mounted at any one of a plurality of test devices, a configuration is preferable where the information is shared by the plurality of test devices via a prescribed network, etc.

In step S3, photographing (image processing for use in difference operations) of the electrode pads included at the semiconductor chip 91 before a probe test is carried out. This image processing may be carried out for all of the electrode pads included at a prescribed semiconductor chip 91 or may be carried out for only the four electrode pads arranged in the vicinity of the corners of the semiconductor chip 91. This may also be carried out for all of the electrode pads of the semiconductor chips included on the semiconductor wafer 90. It is possible to detect only probe marks formed by the final probe test even when a plurality of probe marks are formed at a single electrode pad by performing difference operations on images obtained by the image processing and images for after a plurality of probe tests. In this embodiment, a difference operation is not carried out for all of the electrode pads but a description is given later with respect to the details of the content. The electrode pad images obtained by this difference operation image processing can be used in detailed check of the probe marks (step S7 described later), so that when utilized in a detailed check, it is preferable to carry out the above photographing processing on all of the semiconductor chips.

In step S4, probe testing is carried out on all of the semiconductor chips included in a prescribed semiconductor wafer 90 using a prescribed probe test device installed with the prescribed test probe. Probe marks to be taken as targets of probe mark testing are formed by the probe tests.

In step S5, photographing (image processing for use in probe mark checks) of electrode pads including probe marks formed by the probe tests is carried out by the probe mark reading device. This operation is the above photographing operation described with reference to FIG. 8 etc. This differs from the case for the model registration image processing (step S1) in that there is the possibility that one or more probe marks formed by a different probe test (for example, for the previous time or earlier) may also be present in the image for the electrode pad obtained by photographing as well as the probe mark formed by the probe test.

In step S6, prescribed probe mark checking processing is carried out based on electrode pad images obtained in image processing for use in probe mark checks (step S5). The detailed contents of this process are described in the following.

A further detailed check is carried out in step S7 based on results obtained in step S6 (probe mark checking processing). For example, an image for an electrode pad, including a probe mark determined to be defective by the probe mark checking process is read from the large capacity storage unit 160 and a detailed analysis of the shape and size of the probe mark etc. is performed. This detailed check is typically carried out under the observation of an operator. This detailed check may be omitted if necessary.

Figure 12:
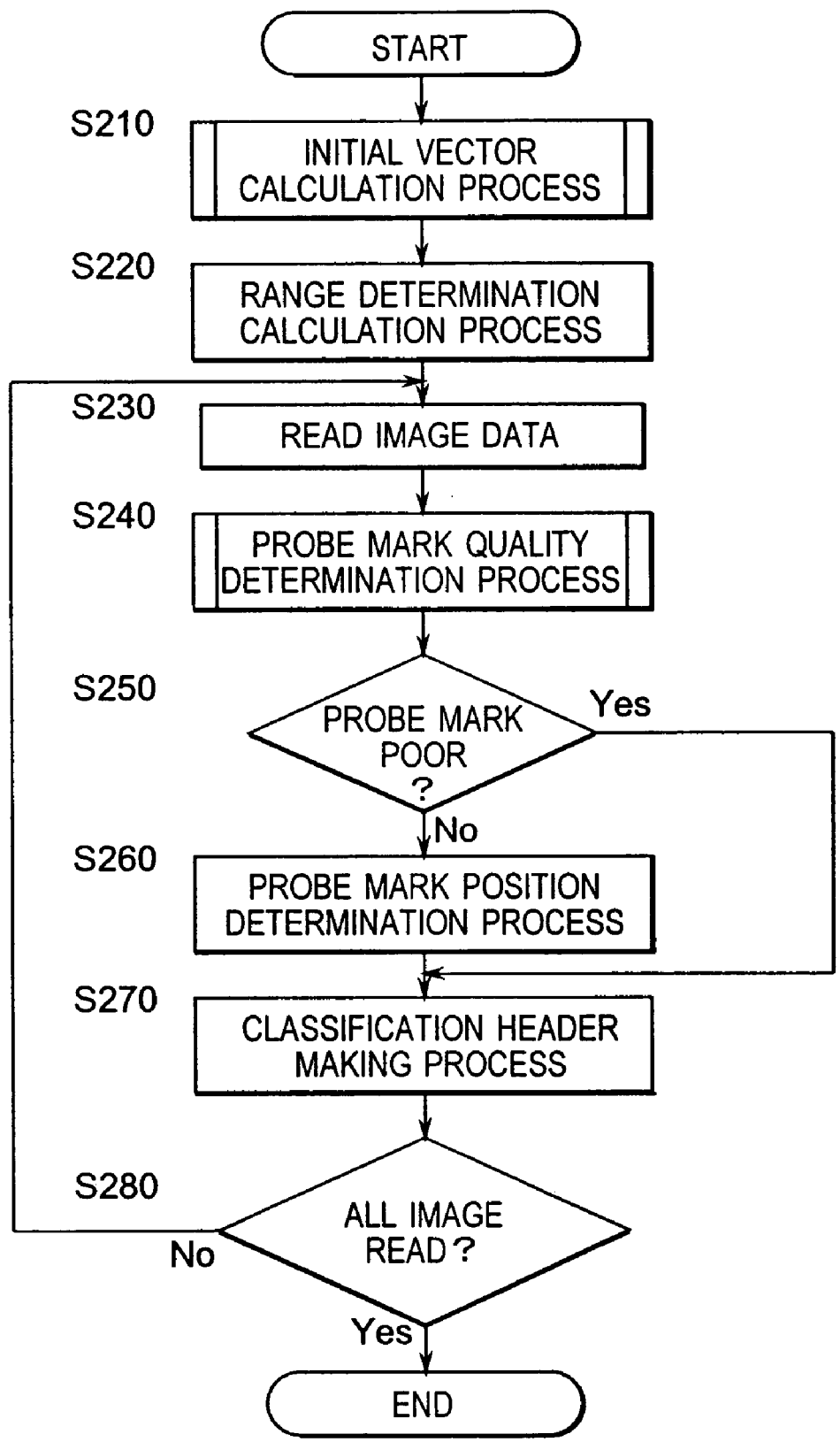
FIG. 12 is a flowchart showing a processing procedure relating to a probe mark checking operation for the computer of the embodiment.

Next, a description is given of the detailed procedure for the probe mark checking operation shown in step S6. FIG. 12 is a flowchart showing the processing procedure relating to a probe mark checking operation of the computer 10.

Figure 13:
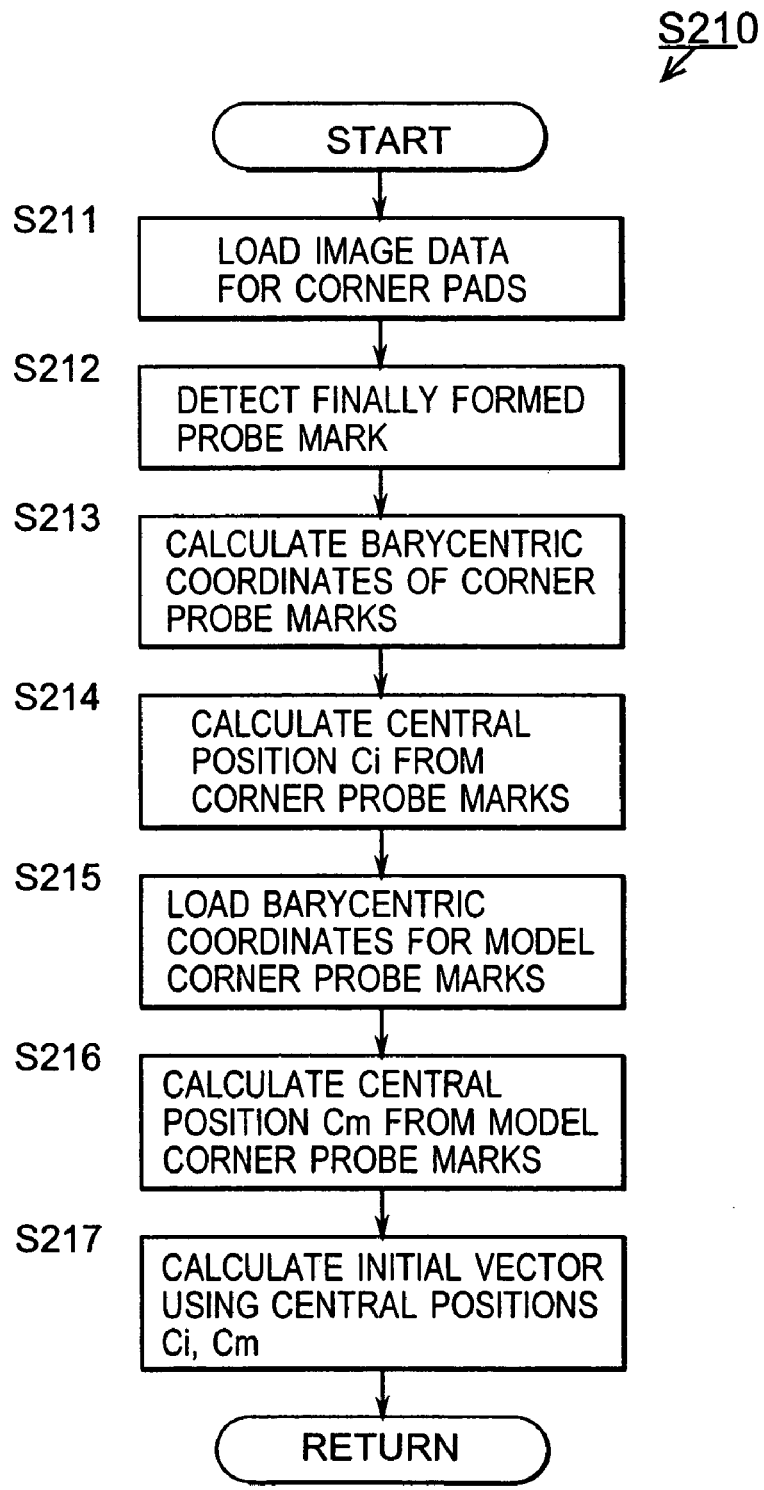
FIG. 13 is a flowchart showing a detailed processing procedure for initial vector calculation processing for the embodiment.

First, a probe mark checking unit 170 that is one function implemented by the computer 10 carries out initial vector calculation processing (step S210) to calculate a vector (hereinafter referred to as "initial vector") indicating the extent to which the position of the probe mark formed due to the probe test differs from the position of the probe mark registered as a model (step S210). A description of the details of the processing (subroutine) for this initial vector calculation processing will now be described with reference to FIG. 13. FIG. 13 is a flowchart showing the procedure for this subroutine.

The probe mark checking unit 170 reads out image data for the corners of images of electrode pads obtained in the probe mark checking image processing (step S5), i.e. reads out data for four electrode pads (hereafter referred to as "corner pads") arranged in the vicinity of the four corners from the large capacity storage unit 160 (step S211).

Figure 14:
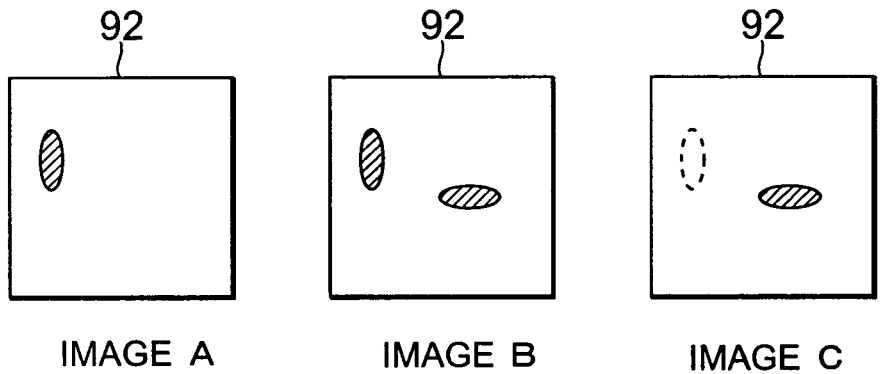
FIG. 14 is a view illustrating an image difference operation of the embodiment.

Next, the probe mark checking unit 170 detects the probe mark formed due to the probe test from the images for the corner pads obtained in step S211 (step S212). When just one probe mark is included in the image for each of the corner pads, detection of the probe mark is straightforward. However, there are also cases where one or more probe marks formed by different (previously carried out or earlier) probe tests exist in addition to the probe mark formed by the probe test. In this case, the probe mark formed by the probe test on this occasion is detected by performing a difference operation between the images of the corner pads obtained in step S211 and the images for the corner pads before this probe test obtained in the image processing for use in difference operations (step S3). FIG. 14 is a view illustrating this difference operation. Image A in FIG. 14 shows an image for a corner pad for before a probe test and image B of FIG. 14 shows an image for a corner pad after a probe test. If a difference operation is then performed between image B and image A, portions that are common to both images shown by the dashed line in image C are deleted so that, as shown in image C, an image only for a corner pad including only a probe mark formed by the probe test on this occasion is obtained. This probe mark is referred to as a corner probe mark.

Continuing on, the probe mark checking unit 170 calculates barycentric coordinates for the corner probe mark from an image for the corner pad including the corner probe mark obtained in step S212 (step S213). The well-known method for calculating these barycentric coordinates is described above for the model registration processing (step S2) and the fact that the barycentric coordinates are coordinates of a prescribed coordinate system preset in the semiconductor chip 91 is also described above.

Next, the probe mark checking unit 170 calculates a barycentric coordinate central position Ci from the barycentric coordinates for the corner probe marks obtained in step S213 (step S214). The barycentric position of the probe mark does not always coincide with the central position of an electrode pad and the central position Ci is therefore the vicinity for which there is no coincidence with the central position of the semiconductor chip 91.

Further, the probe mark checking unit 170 reads baryocentric coordinates of probe marks of the baryocentric coordinates of probe marks taken as models saved in the model registration process (step S1) that are for probe marks (hereafter referred to as model corner probe marks) taken as models for the electrode pads positioned in the vicinity of the four corners of the semiconductor chip (step S215).

Next, the probe mark checking unit 170 calculates a barycentric coordinate central position Cm from the barycentric coordinates for the model corner probe marks read in step S215 (step S216). This central position Cm is the vicinity where the central position of the semiconductor chip 91 and the central position Ci do not coincide.

Finally, the probe mark checking unit 170 calculates a vector (hereafter referred to as "initial vector") drawn from the central position Cm calculated in step S216 to the central position Ci calculated in step S214. (step S217). This initial vector can then be used in the following processing as a vector indicating shifts from the probe mark registered as a model to a probe mark formed by the probe test. When the subroutine processing shown above ends, the processing shown in FIG. 12 is returned to.

Figure 15:
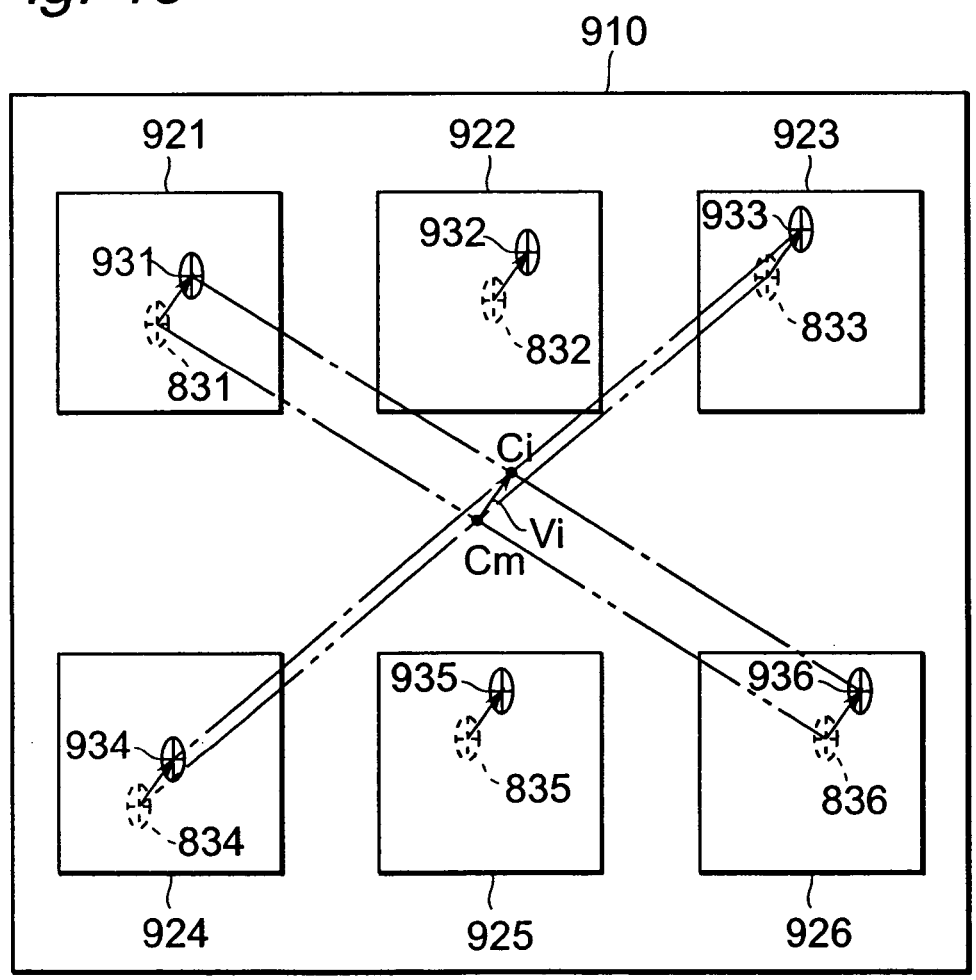
FIG. 15 is a schematic view illustrating initial vector calculation of the embodiment.

The reason for calculating the initial vector using the central position Ci calculated based on the barycentric coordinates for the corner probe mark and the central position Cm calculated based on barycentric coordinate of the model corner probe mark is described in detail with reference to FIG. 15. FIG. 15 is a schematic view illustrating initial vector calculation. A semiconductor chip 910 shown in FIG. 15 has six electrode pads 921 to 926 and these electrode pads include probe marks 931 to 936 formed by a probe test. The probe marks 831 to 836 registered as models corresponding to these probe marks are shown by the dotted lines in FIG. 15 and the barycentric positions of the probe marks are shown by cross-marks. An intersection point of a line connecting barycentric positions of the corner probe marks 933 and 934 of the semiconductor chip 910 and a line connecting barycentric positions of the corner probe marks 931 and 936 is taken as a central position Ci of these probe marks. Similarly, an intersection point of a line connecting barycentric positions of model corner probe marks 833 and 834 and a line connecting barycentric positions of model corner probe marks 831 and 836 is taken as a central position Cm of these probe marks.

An initial vector Vi that is a vector going from the central position Cm to the central position Ci is not completely the same as vectors from the barycentric positions of the model corner probe marks 831, 833, 834 and 836 to the barycentric positions of the corresponding corner probe marks 931, 933, 934 and 936. The reason for this is that the (for example, new) test probe forming the probe marks taken as models has an ideal arrangement and vectors indicating directions of shifting of the test probe should all be the same and should be equal to the initial vectors. However, a test probe used a number of times in probe tests may become bent, chipped or worn etc. due to age deterioration so that the arrangement may shift from the ideal. Further, there may be shifting from the ideal position at the time of positioning the semiconductor chip 910. In particular, cases where there is slight shifting in the X or Y directions or in the direction of rotation from the ideal position on the occasion of mounting of the semiconductor chip 910 on the X-Y stage 40 are common. Shifts in the direction of rotation can then be seen as relatively large variations at the corner pads of the semiconductor chip 910. In this embodiment, the initial vector described above is calculated taking note of corner probe marks in order to average out shifts in the direction of rotation and other shifts. It is preferable to calculate vectors from probe marks taken as models for all of the electrode pads to probe marks formed by the probe test in order to completely average out the shifts. On the other hand, this processing takes a great deal of time due to there being a great deal of calculation involved. It goes without saying that it is preferable to detect the probe marks at high speed. The above configuration is preferable with regards to this point due to the fact that calculating the initial vector taking note of the four corner pads is capable of averaging out shifts in the direction of rotation in a sufficiently reliable manner so as to enable initial vectors to be calculated quickly.

In this embodiment, the initial vectors are calculated using the central position Ci and the central position Cm. However, it is also possible to obtain the initial vector drawn from an average position of some or all of the barycentric positions of the model corner probe marks 831, 833, 834 and 836 to an average position for some or all of the barycentric positions of the corresponding corner probe marks 931, 933, 934 and 936. Further, it is also possible to calculate the initial vectors based on prescribed probe marks other than the model corner probe marks and the corner probe marks.

Referring again to FIG. 12, when the initial vector calculating process (step S210) finishes, the probe mark checking unit 170 carries out determination range calculation processing in order to determine the quality of the probe marks (step S220). As described above, providing there are no abnormalities with the test probe, the probe marks formed at the electrode pads by the probe test are positioned in a vicinity that is in a direction and distance shown by the initial vector from the probe mark taken as a model. The range indicating the limit that can be said to be this vicinity is referred to here as the determination range. It is necessary to decide this determination range taking into consideration an amount of shift of the probe mark position formed due to a prescribed test probe taken as a model, a maximum amount of shift of all of the probe mark positions formed by the test probe taken as all of the models, and an amount of shift occurring due to age deterioration due to a number of probe tests. The following is a description with reference to FIG. 16 and FIG. 17.

Figure 16:
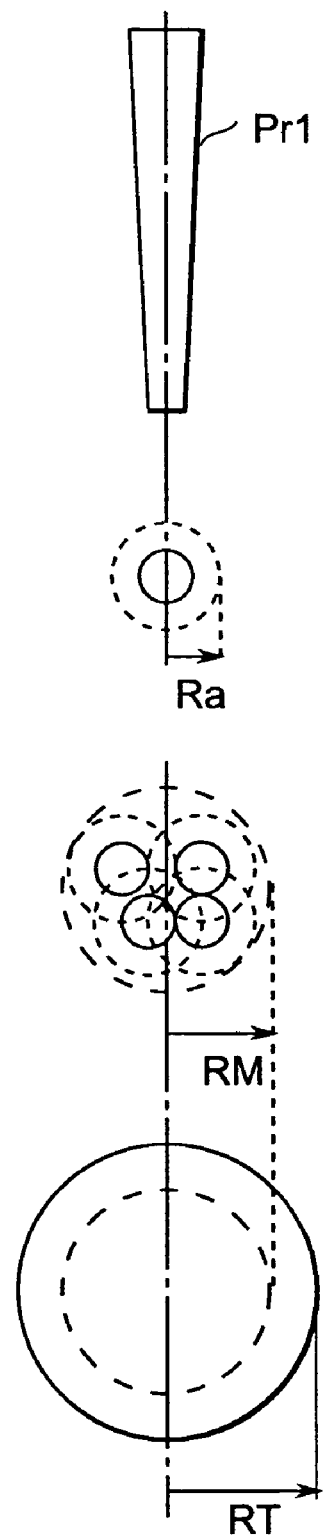
FIG. 16 is a schematic view illustrating extents of shifts occurring due to a first probe in the embodiment.
Figure 17:
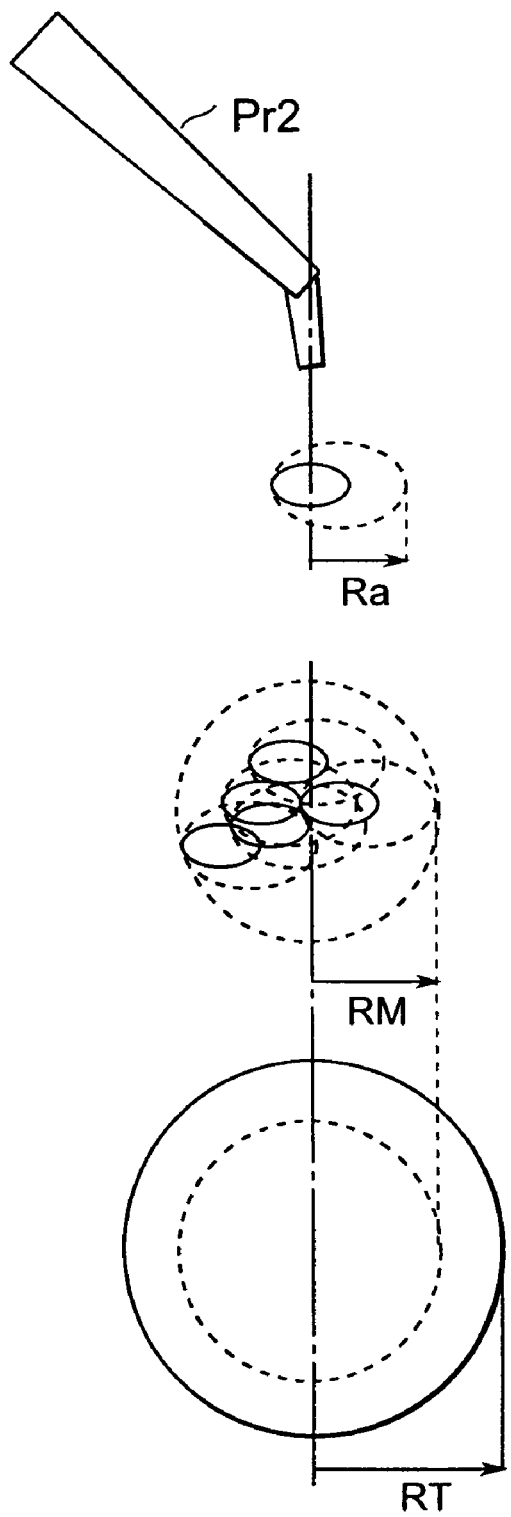
FIG. 17 is a schematic view illustrating extents of shifts occurring due to a second probe in the embodiment.

FIG. 16 is a schematic view illustrating an amount of shift due to a first probe Pr1 and FIG. 17 is a schematic view illustrating an amount of shift due to a second probe Pr2. In the drawings, Ra shows an extent of shifting of probe mark positions formed by the first and second probes Pr1 and Pr2 of different shapes, with a dotted line showing the range of this shifting. This amount of shifting Ra can be obtained in advance using numerical calculations from the amount of flexing and bending based on the shape of the first and second probes Pr1 and Pr2, rigidity of metal constituting this material, and applied load, etc.

Further, RM in the drawings shows the maximum amount of shift in all of the probe mark positions formed by all of the test probes used when the first and second probes Pr1 and Pr2 are taken as model test probes. This amount of shift RM can easily be obtained from the positions of all of the probe marks registered as models. For example, it is possible to consider calculating a difference between a respective minimum value and maximum value for an X-coordinate and a Y-coordinate for barycentric coordinates for a probe mark registered as a model, divide values for which this difference is larger by two to give a value, and then take this value with Ra added as RM. The amount of shift RM being bigger than the amount of shift Ra depends on the presence of slight variations in the shape etc. of each test probe and the presence of slight variations in a fitting position varying slightly from a calculated position.

Further, RT in the drawings shows the maximum amount of shift in all of the probe mark positions formed by all of the test probes taking into consideration shifts occurring due to age deterioration due to carrying out a plurality of probe tests. This amount of shift RT can easily be obtained from all of the positions of probe marks actually formed but this is troublesome and takes a great deal of time as it requires a great deal of calculation and involves a substantial amount of processing. It goes without saying that it is preferable to detect the probe marks at high speed. The amount of shift RT is calculated by multiplying the amount of shift RM by a prescribed coefficient larger than 1 obtained taking into consideration experience of the influence of age deterioration. This may also be calculated taking into consideration the amount of shift of the four corner probe marks. The determination range of the probe mark checking unit 170 has a determination range that is a circle with the calculated shift amount RT as a radius.

Figure 18:
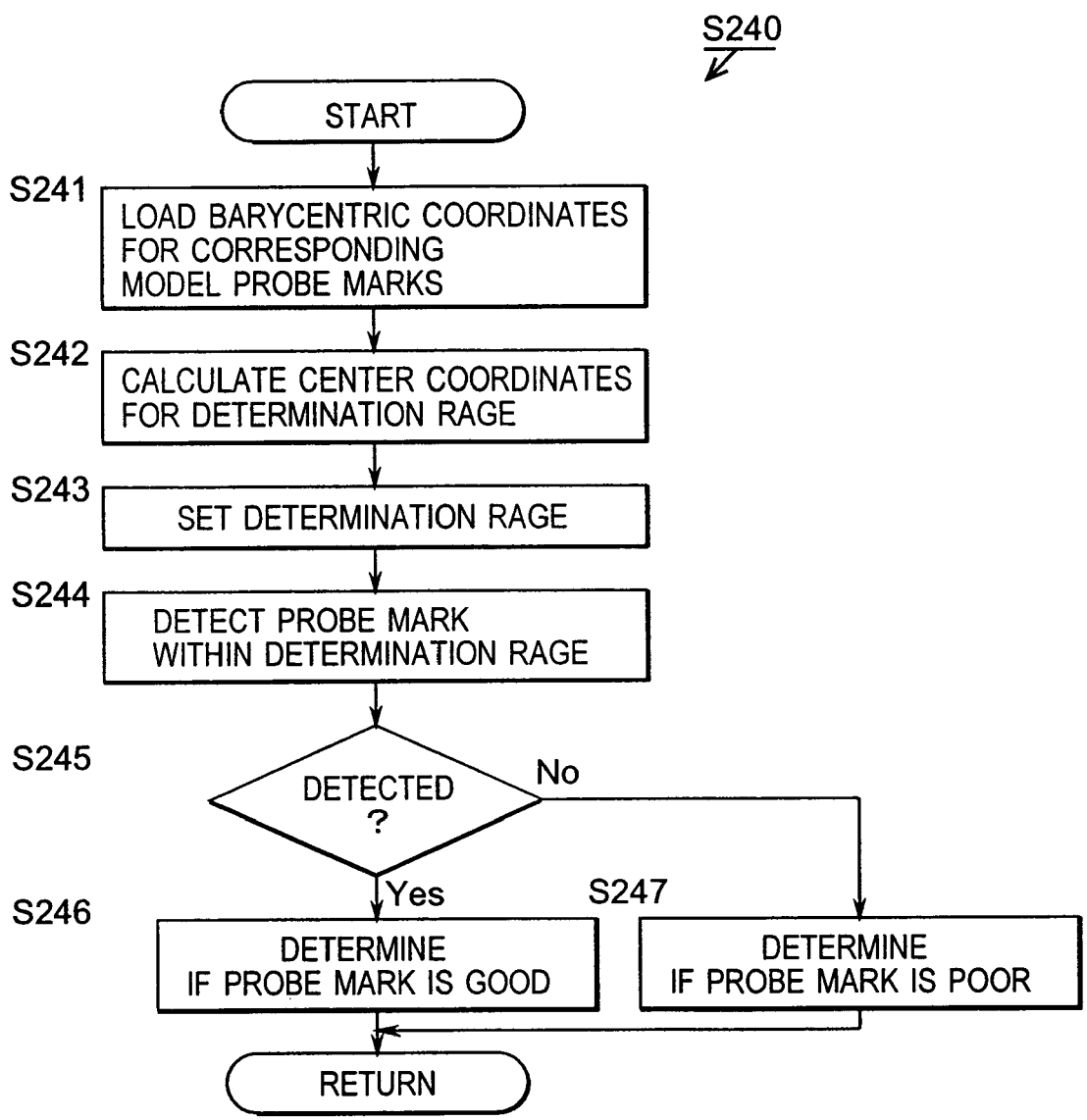
FIG. 18 is a flowchart showing a detailed procedure for probe mark quality determination processing of the embodiment.

Next, the probe mark checking unit 170 reads images for electrode pads taken as targets of a probe mark check from the large capacity storage unit 160 (step S230). Next, the probe mark checking unit 170 carries out processing to determine quality of probe marks included in the read-out electrode pad images (step S240). A description of the details of the processing (subroutine) for this quality determination process will now be described. FIG. 18 is a flowchart showing the procedure for this subroutine.

The probe mark checking unit 170 reads out from the large capacity storage unit 160 barycentric coordinates for probe marks pre-registered as models corresponding to the electrode pads read out in step S230 (step S241).

Next, the probe mark checking unit 170 calculates coordinates for a point in a direction and distance specified by the initial vector calculated in step S230 from the barycentric positions of the probe marks taken as models read out in step S230. Ideally, it is preferable to set the determination range taking this point as center because there is a barycentric coordinate for the probe mark formed by a probe test in the vicinity of this point (the center coordinate).

Next, the probe mark checking unit 170 sets the determination range as a circle taking the amount of shift RT calculated in step S220 as a radius and taking the center coordinate of the determination range calculated in step S242 as center (step S243). Here, the determination range is taken to be a circle but any kind of shape such as a square, etc. is also possible.

Further, the probe mark checking unit 170 detects probe marks from a prescribed region of the electrode pad image within the determination range set in step S243 (step S244). Well known image processing methods such as detection methods based on pixel luminance etc. can be used in detection of probe marks. It is therefore not necessary to check the whole of the image for the electrode pads because in this embodiment, only probe marks for a prescribed region within the determination range are detected. It is therefore possible to detect probe marks at high speed.

Next, the probe mark detecting unit 170 determines whether or not probe marks are detected in step S244 (step S245). When a probe mark is detected, the probe mark is determined to be good, the determination results are stored in memory etc. and the processing of FIG. 12 is returned to (step S246). When a probe mark is not detected, the probe mark is determined to be bad, the determination results are stored in memory etc. and the processing of FIG. 12 is returned to (step S247). In step S244, when part of a probe mark is detected within the determination range, this is handled as though a probe mark is not detected because the whole of the probe mark cannot be detected.

Figure 19:
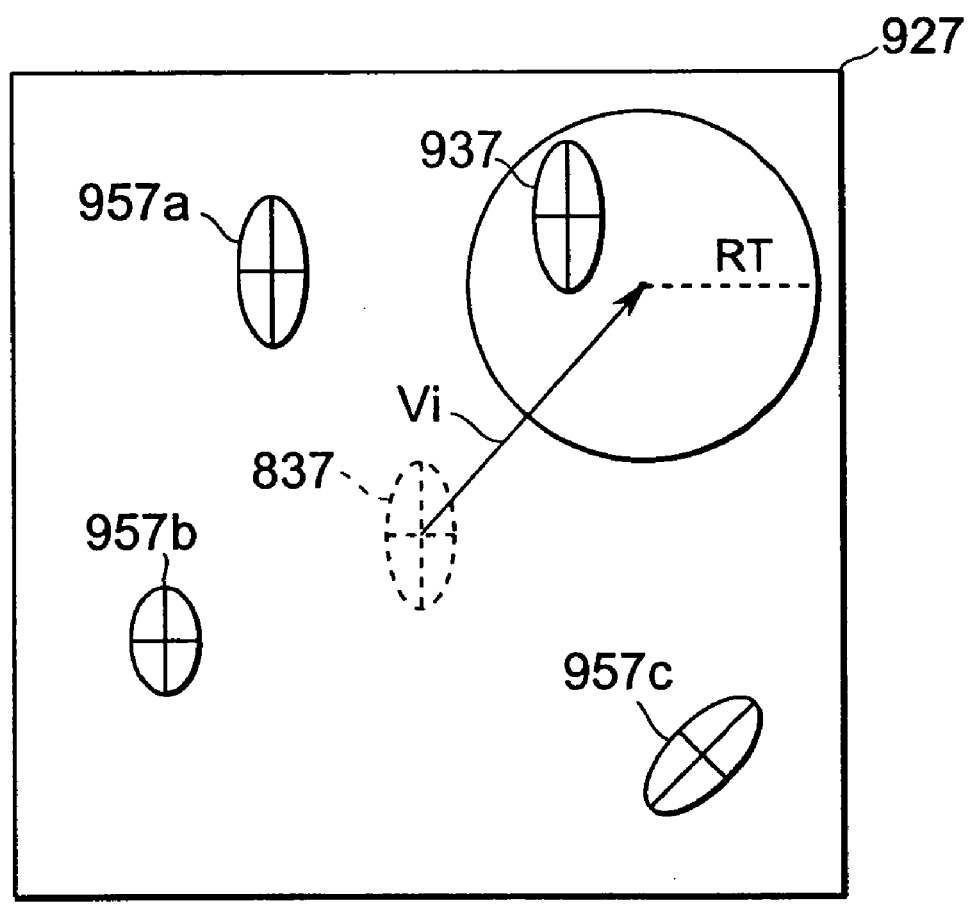
FIG. 19 is a view showing an example of probe mark detection in probe mark quality determination processing of the embodiment.

FIG. 19 is a view showing an example of probe mark detection in probe mark quality determination processing. An image 927 of an electrode pad shown in FIG. 19 includes a probe mark 937 formed by a probe test on a current occasion and probe marks 957a, 957b and 957c formed by probe tests on a previous occasion and beforehand. Further, the probe mark 837 registered as a model corresponding to the probe mark 937 is shown by the dotted lines in FIG. 15 and the barycentric positions of the probe marks are shown by cross-marks. Referring to FIG. 19, probe mark 937 is present within a circle of radius RT from the center coordinate of the determination range and a probe mark is detected from the image within the circular determination range. A determination is therefore made that the probe mark 937 is good.

Figure 20:
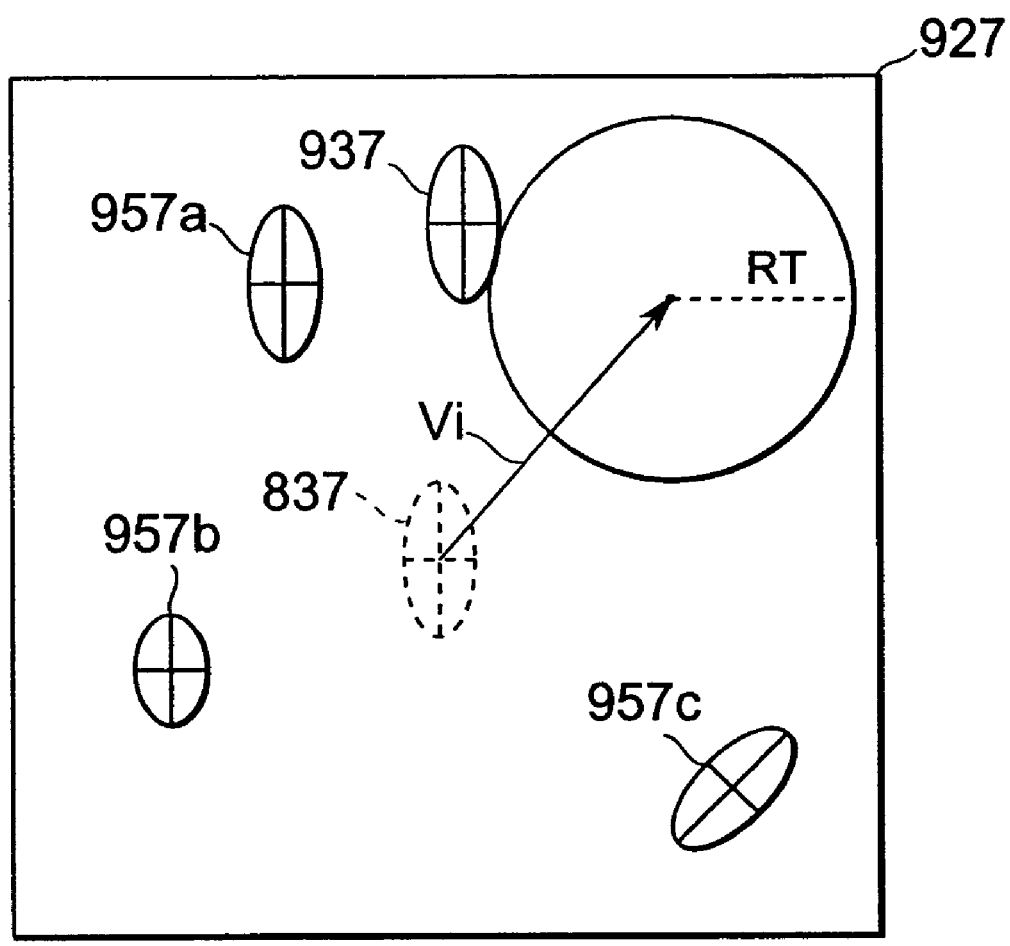
FIG. 20 is a view showing a further example of probe mark detection in probe mark quality determination processing of the embodiment.

FIG. 20 is a view showing a further example of probe mark detection in probe mark quality determination processing. Each of the elements in FIG. 20 which is the same as in FIG. 19, is given the same numeral, and description thereof is omitted. The example shown in FIG. 20 differs from the example shown in FIG. 19 in that probe mark 937 is present outside a circle of radius RT from the center coordinate of the determination range and a probe mark is therefore not detected from the image within the circular determination range. A determination is therefore made that the probe mark 937 is poor.

Referring again to FIG. 12, when the above probe mark quality determination process (step S240) ends, based on the results of the quality determination process, the probe mark checking unit 170 omits the process of step S260 when the probe mark is poor and carries out the process of step S270, and when the probe mark is good, carries out the process of step S260 (step S250).

Next, the probe mark detecting unit 170 carries out a probe mark position determination process to determine whether or not the probe mark position is good for each probe mark that is determined to be good (step S260). A protective part (passivation part) is normally formed in the vicinity of the edge of an electrode pad and problems such as conduction defects etc. may therefore occur in the probe test when the region occupied by the probe mark overlaps with the region for the protective part. It is therefore necessary to determine that the probe mark position is poor when this kind of overlapping occurs. Specifically, maximum and minimum values are calculated for the X-coordinate and Y-coordinate of the probe mark and quality of the probe mark position is then determined by determining whether or not these coordinates fall within the region of the protective part.

Figure 21:
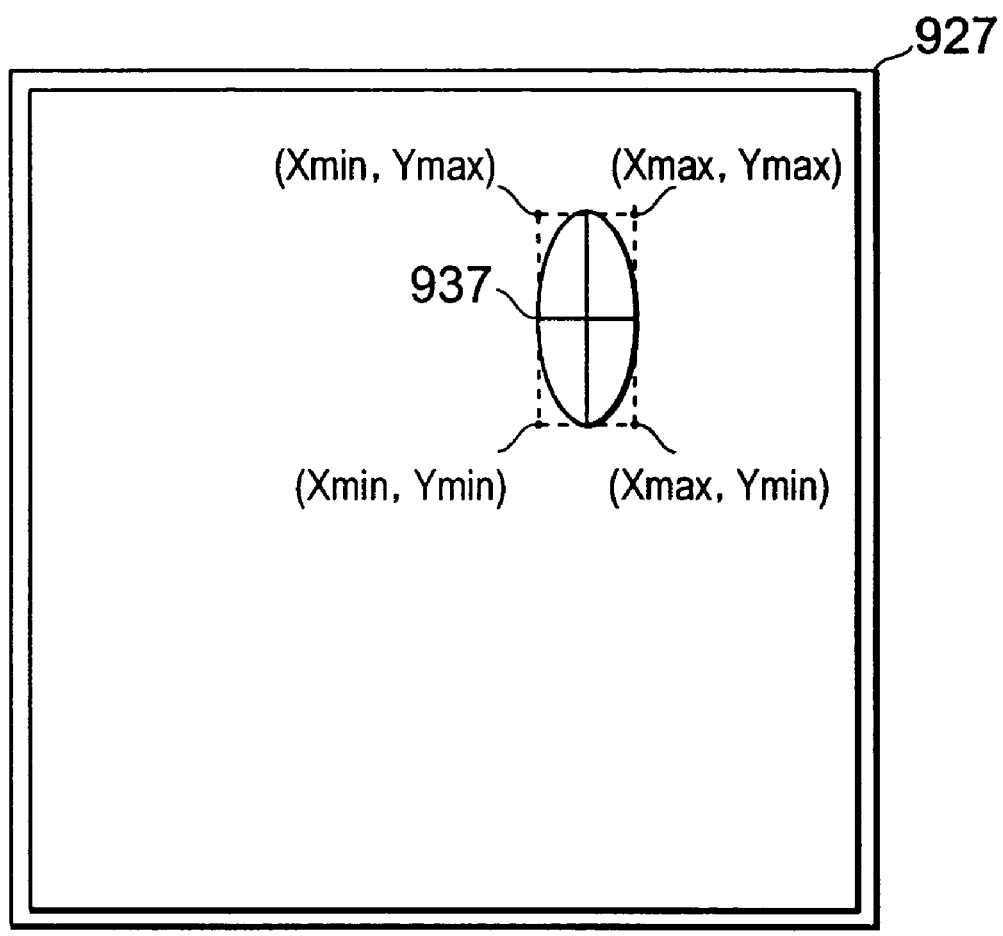
FIG. 21 is a view showing maximum values and minimum values for X-coordinates and Y-coordinates of probe marks of the embodiment.

FIG. 21 is a view showing maximum values and minimum values for X-coordinates and Y-coordinates of probe marks. In FIG. 21, Xmax shows the maximum value of the X-coordinate of the probe mark, Xmin shows the minimum value of this X-coordinate, Ymax shows the maximum value of the Y-coordinate, and Ymin shows the minimum value of the Y-coordinate. The image 927 of the electrode pad shown in FIG. 21 has a protective part formed in the vicinity of the edge. However, none of Xmax, Xmin, Ymax and Ymin fall within the protective part and the region occupied by the probe mark 937 can therefore be determined not to overlap with this protective part.

Figure 22:
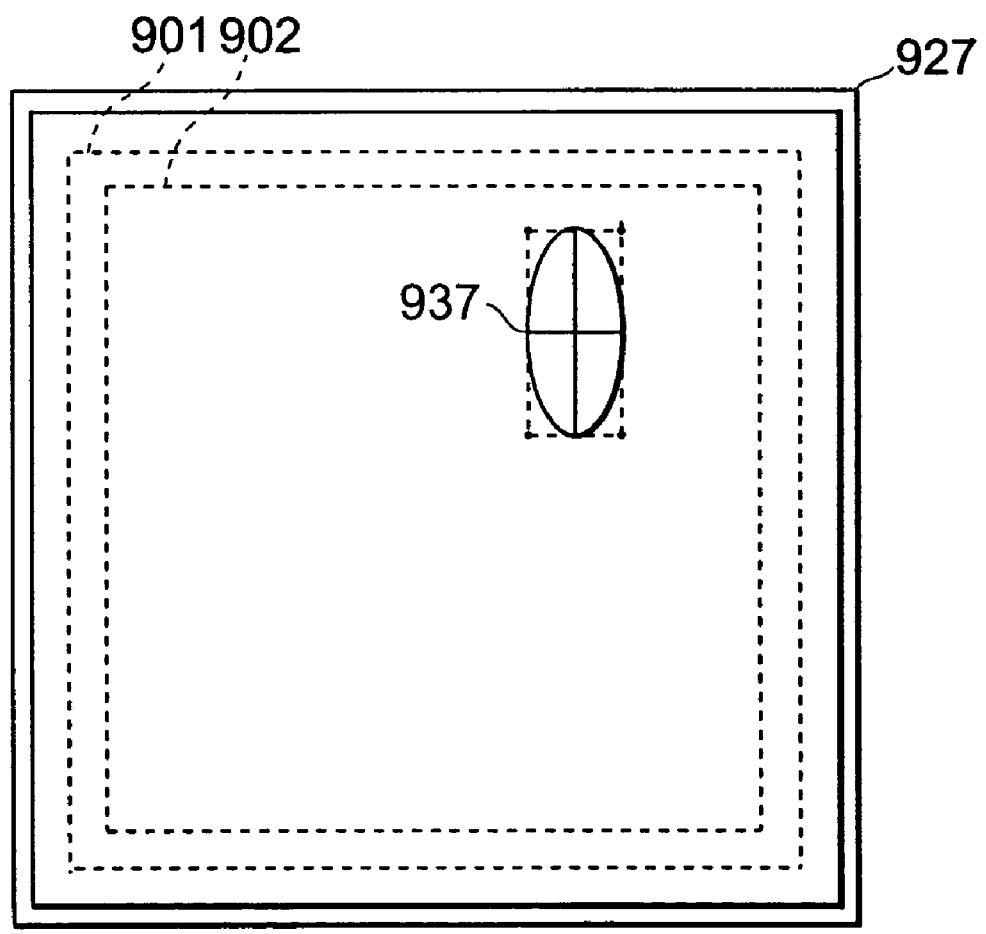
FIG. 22 is a view showing borderlines for determining the extent of proximity of the region occupied by probe marks and adjacent protective part in the embodiment.

Problems may, however, occur in cases where the region occupied by the probe mark 937 is close to the protective part, and it may therefore be necessary to perform a detailed check (step S7). In the above probe mark position determination process, the extent of the proximity of the region occupied by the probe mark 937 and the protective part is collectively determined. The following is a description with reference to FIG. 22. FIG. 22 is a view showing a borderline for determining this extent of proximity. When the value of one of Xmax, Xmin, Ymax and Ymin is a coordinate corresponding to outside of a first borderline 901, the probe mark is within or is extremely close to the protective part and the probe position is determined to be poor. When the value is a coordinate corresponding to inside of the first borderline 901 but is a coordinate corresponding to outside of a second borderline 902, the probe mark does not overlap with the protective part but is relatively close and the probe mark position is determined to require further investigation. When the value is a coordinate corresponding to inside of the second borderline 902, the probe mark is distanced from the protective part and the probe mark position is determined to be good. The results of this determination (poor, requires further investigation, good) are stored temporarily in memory etc.

Referring again to FIG. 12, when the above probe mark position determination process (step S260) ends, the probe mark determination unit 170 performs processing to make a prescribed classification header based on each of the determination results temporarily stored in memory etc. The classification header may include, for example, test date, tester number, probe model (model probe mark) number, wafer product name, wafer lot number, chip number, pin (electrode pad) number, probe determination (probe quality determination) results, probe position determination results, and prescribed probe mark detection parameters, etc. The probe determination (probe mark quality determination) results include data indicating "good or poor" as results obtained in the probe mark quality determination process (step S240) and a shift amount RT obtained in the determination range calculation process (step S220). The probe position determination process includes data indicating "poor", "requires further investigation", and "good" obtained in the probe mark position determination process (step S260). Prescribed probe mark determination parameters may include barycentric coordinates for a probe mark, and Xmax, Xmin, Ymax and Ymin values, and may further include area and aspect ratio of the probe mark obtained through prescribed calculations. The classification header including the above content correlated with image files of the electrode pads is stored in (a prescribed folder etc. of) the large capacity storage unit 160. By using this classification header, images of electrode pads to be checked can be efficiently designated and read out during detailed checks (step S7) carried out afterwards.

Next, the probe mark detecting unit 170 reads out images for all of the electrode pads included in the semiconductor chip 91 and determines whether or not checking has been performed (step S280). When all of the images are not read out, in order to read out an image for the next electrode pad, the process of step S230 is returned to, and the above processing is repeated until all of the images are read out (S230→S240→S250→(S260)→S270→S280→S230). When all of the images are read out, checks for all of the probe marks included in the semiconductor chip 91 are complete. Continuing on, photographing of the electrode pads included in the next semiconductor chip included in the semiconductor wafer 90 takes place, and then the same processing as described above (step S210 to step S270) is commenced in order to check probe marks on the electrode pads. This process is then repeated until photographing and probe mark checking are complete for all of the semiconductor chips included in the semiconductor wafer 90.

In the above, the probe mark checking operation of the computer 10 including the above processing (step S210 to step S270) is carried out after completion of the photographing operation for the electrode pads of the semiconductor chip but if the processing speed of the computer 10 is sufficiently high, it is also possible to carry out the probe mark checking operation for each pad every time a single electrode pad is photographed. These operations may also be carried out concurrently.

4. Effects

According to this embodiment, the probe mark reading device moves the semiconductor wafer 90 mounted on the mounting table in the X-direction at a fixed speed using the X-Y stage 40, with pictures being taken in order of the electrode pads lit up by bursts of light from the light source 30 by the CCD camera 20. With this configuration, the probe mark reading device is capable of acquiring images for electrode pads and read probe marks without putting a user to any trouble and in a short period of time.

Further, according to this embodiment, the probe mark reading device is configured so as to photograph electrode pads lit up for a short period of time by bursts of light from the light source 30 in order using the CCD camera 20. With this configuration, the probe mark reading device is capable of ensuring that images taken do not blur and also that images can be captured with a device configuration that is straightforward and inexpensive compared with control using devices having physical shutters, etc.

Further, according to the first embodiment, the trigger signal generator 110 included in this probe mark reading device calculates coordinates corresponding to central positions of all of the electrode pads to be photographed based on layout information Ia relating to the layout of the semiconductor chips 91 stored in the wafer information storage unit 105 and the layout of the electrode pads 92 etc. As a result, it is possible to read a multiplicity of probe marks formed at a multiplicity of electrode pads which are by no means arranged at equal intervals and for which the possibility of the layout position changing depending on the semiconductor wafer exists at high speed.

Moreover, according to this embodiment, the probe mark reading device carries out time-consuming difference operations for images only when calculating initial vectors, with determination of quality of the probe marks in other probe mark checks then being carried out based on initial vectors and prescribed determination range (shift amount RT). It is therefore possible to determine probe mark quality and probe mark position of probe marks formed by a final probe test at a high speed even in cases where a plurality of probe marks are included in the image taken for an electrode pad. For example, if difference operations are to be carried out of subtracting the images for before a probe test from the images for one thousand electrode pads (i.e. 1000 pins), the time required to perform one difference operation is approximately 200 milliseconds and the time required to read out one image for before the final probe test is in the order of 30 milliseconds. The time required to read all of the probe marks is therefore in the order of 230 seconds (approximately four minutes). In this respect, when the probe mark checking of this embodiment is carried out on images for one thousand electrode pads, the time required to detect one probe mark is in the order of 10 milliseconds and a check of all the probe marks is completed in ten seconds. It can therefore be understood that the probe mark checking of this embodiment can be carried out at extremely high speed. Further, according to a difference operation in pixel units, there is the possibility of erroneous detections etc. occurring due to shifts at the time of acquisition of an image but according to the probe mark checking operation of this embodiment, reliable probe mark checks can be carried out without being influenced by shifting at the time of image acquisition or changes in pixel luminance etc. because relative position detection is carried out based on an initial vector.

5. Modified Examples

In the above embodiment, the central coordinates and photographing positions for the (images 51 including images taken for the) electrodes 92 coincide. A configuration is adopted having just a single electrode pad 92 included in the image data Di but the number of electrode pads 92 to be photographed once may also be multiple. For example, when central position of a straight line connecting the central positions of adjacent electrode pads, i.e. the central positions of adjacent electrode pads and photographing positions coincide, there are two electrode pads 92 included in the image data Di.

Figure 9:
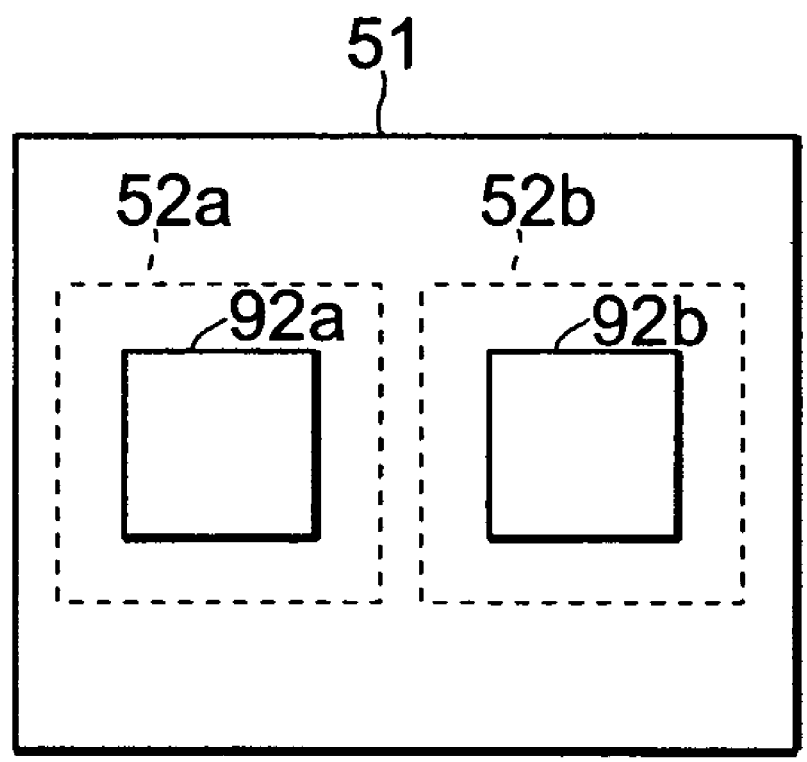
FIG. 9 is a view showing an example of an image including an image taken for two electrode pads of a modified example of the embodiment.

FIG. 9 is a view showing an example of an image 51 including images taken for two electrode pads 92a and 92b with this configuration. The central positions of the regions within trimming borderlines 52a and 52b corresponding to the electrode pads 92a and 92b can then easily be calculated from the layout information Ia relating to the layout etc. of the electrode pads 92a and 92b indicated by the wafer information storage unit 105. It is therefore straightforward to set trimming boundary lines 52a and 52b with respect to the image 51. Trimmed image data Di' is therefore easily created from an image taken for electrode pads 92a and 92b within trimming boundary lines 52a and 52b without it being necessary to perform trimming processing by recognizing the image taken for the electrode pad 92a and 92b using well-known image recognition processing.

Figure 10:
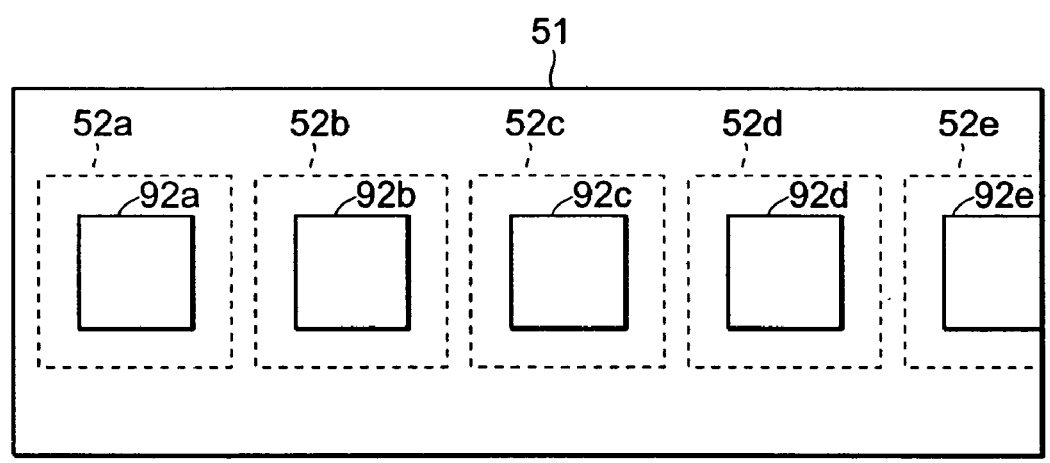
FIG. 10 is a view showing an example of an image including an image taken for four and a half electrode pads of a modified example of the embodiment.

When the CCD camera 20 has extremely high resolution, images for a greater number of electrode pads can be obtained using one-time photographing operations. FIG. 10 is a view showing an example of an image 51 including images taken for four and a half electrode pads 92a to 92e, Central positions of trimming border lines 52a to 52e corresponding to images taken for the electrode pads 92a to 92e can easily similarly be calculated from layout information Ia relating to the arrangement of electrode pads etc. indicated by the wafer information storage unit 105. A plurality of trimmed image data Di' composed of images taken for the electrode pads 92a to 92e within the trimming border lines 52a to 52e can then easily be made. Here, the image for the electrode pad 92e is discarded because the whole of the pad is not photographed but a configuration where the whole of the image is created by synthesis with the remaining portion of the image taken next is also possible.

According to the configuration where images for two or more electrode pads are acquired through one photographing operation, it is possible to acquire images for two or more electrode pads in order in the time that the CCD camera 20 takes to photograph a single image. It is then possible to move the (mounting table of the) X-Y stage 40 at a speed of two times greater, or more. With this configuration, the probe mark reading device is capable of acquiring images for electrode pads and read probe marks in a still shorter period of time. In the above modified example, the plurality of photographed electrode pads are adjacent to each other in the X-direction as shown in FIG. 10. However, a configuration where a plurality of electrode pads adjacent to each other in the Y-direction or a plurality of electrode pads adjacent to each other in the X-direction and the Y-direction are photographed once is also possible. With this configuration, it is possible to make the distance moved in the Y-direction of the photographing position after completion of reading in the X-direction large (for example, two lines or more). It is then possible to acquire images of electrode pads and read probe marks in a short period of time.

In the above embodiment, the light source 30 lights up the prescribed portion by generating a high-intensity burst of light for just a short time of a few microseconds from the time of being provided with a flash signal Sf so as to enable the CCD camera 20 to acquire a photographed image with no blurring. Providing that the configuration is capable of taking images that do not blur, a configuration where a shutter device is provided at some point in the light path from the light source 30, via the semiconductor wafer 90 to a light-receiving element built-into the CCD camera 20 so as to normally block the light path, and then open the light path for just a short period of time. The shutter device may also be implemented electronically. According to these configurations, the light source 30 is by no means limited to a flash such as, for example, a xenon flash lamp. It is also possible to adopt a configuration where the X-Y stage 40 is controlled in such a manner that the speed of movement before moving to the electrode pads at the photographing position is slowed down in order to take images using the CCD camera 20 that are not blurred. However, the average speed will become slower with this configuration due to repeated acceleration and deceleration. The above embodiment is therefore more preferable when movement takes place at a fixed fast speed.

In the above embodiment, a configuration is adopted where a photographing position is consecutively moved by moving the position of a semiconductor wafer 90 to be photographed using an X-Y stage 40. However, rather than using an X-Y stage 40, a camera moving device or camera oscillating device where the photographing position is moved in the X-direction or Y-direction by changing the position or photographing angle of the CCD camera 20 could also be provided. Moreover, it is also possible to have a configuration where a reflection angle changing device is provided, where a reflecting mirror is arranged and the X-Y stage omitted so that an image of the electrode pad 92 is provided to the CCD camera 20 via the reflecting mirror, with the photographing position of the CCD camera 20 then being changed in the X-direction and the Y-direction by changing the angle of the reflecting mirror. Moreover, a configuration where photographing positions are consecutively moved to as a result of an appropriate combination of these configurations is also possible.

In the above embodiment, a configuration is adopted where electrode pads 92 included on a single semiconductor chip of a semiconductor wafer 90 are photographed in order but it is also possible to photograph the whole of the semiconductor wafer 90 in order. Namely, it is also possible to photograph electrode pads 92 included on a plurality of semiconductor chips during photographing in the X-direction in order. In the case of this kind of photographing, which photographed electrode pads correspond to which semiconductor chip can easily be determined based on the layout information Ia relating to layout etc. of the semiconductor chips indicated by the wafer information storage unit 105.

In the above embodiment, feedback control can be carried out based on the encoder signal Se from the X-Y stage 40. However, without basing control on this encoder signal Se, in cases where reliable determination of a position where the mounting table of the X-Y stage 40 is intended to be is possible using the X-Y stage controller 120, it is also possible to carry out control based on this intended position.

In the above embodiment, a probe mark checking operation is carried out on images for electrode pads obtained by consecutively taking pictures of a semi conductor wafer 90 on (a mounting table of) an X-Y stage 40 moving at a fixed speed using a CCD camera 20. However, it is sufficient for images taken of electrode pads to exist in order to implement the probe mark checking operation. It is by no means necessary to carry out the aforementioned photographing operation as a prerequisite of the probe mark checking operation and, for example, images or electrode pads may be acquired using a related photographing operation. Images for electrode pads taken by a different device to this device may then be provided to this device, so that probe mark checking is carried out based on these provided images. The embodiment as described above may also be applied to probe mark test devices for performing just probe mark checking operations.

In the above embodiment and modified examples, a configuration is adopted where electrode pads 92 included in a semiconductor chip are photographed. However this invention is applicable to any configuration where electrode pads included in a prescribed object other than the semiconductor chip are photographed or checked. In such a case, coordinates of each electrode pad in a prescribed coordinate system set with respect to the object can easily be calculated based on prescribed layout information relating to layout etc. of the electrode pads.

While the invention has been described in detail, the foregoing description is in all aspects illustrative and not restrictive. It is understood that numerous other modifications and variations can be devised without departing from the scope of the invention.

This application claims priority based on Japanese Patent Application No. 2002-312579 entitled "Probe Mark Reading Device and Probe Mark Reading Method" filed on Oct. 28, 2002, and Japanese Patent Application No. 2003-194541 entitled "Probe Mark Reading Device and Probe Mark Reading Method" filed on Jul. 9, 2003, the contents of which are hereby incorporated by reference.

What is claimed is:

1. A probe mark reading device for reading probe marks formed on electrode pads during checking of electrical characteristics of a prescribed object including a plurality of electrode pads, comprising:
   an illuminating unit for illuminating the plurality of electrode pads;
   a photographing unit for photographing a part of the plurality of electrode pads illuminated by the illuminating unit and outputting images obtained by photographing as electrical signals;
   a photographing position changing unit for enabling photographing all the plurality of electrode pads by consecutively changing a photographing position to be photographed by the photographing unit; and
   a storage unit for receiving the electrical signals from the photographing unit and saving the image obtained from the electrical signals,
   wherein an image of the part of the plurality of electrode pads to be photographed is supplied to the photographing unit for just a prescribed time in which the photographing position changing unit positions the photographing position to coincide with the position of the part of the plurality of electrode pads.

2. The probe mark reading device of claim 1, wherein the photographing position changing unit changes the photographing position at a predefined moving speed so as to enable photographing in order of images for all of the electrode pads in such a manner as to open up a time gap of photographing time required to acquire a single image in the case of consecutive photographing by the photographing unit or longer.

3. The probe mark reading device of claim 1, wherein an image of the part of the plurality of electrode pads to be photographed by the photographing unit is provided as a result of the illuminating unit being provided with a flash emitting a flash of light for just a prescribed period of time in the vicinity of the time where the part of the plurality of electrode cads is photographed by the photographing unit.

4. The probe mark reading device of claim 1, further comprising:
   a storage unit for storing layout information that is data relating to layout positions of the plurality of electrode pads; and
   a trigger unit for calculating a position for the part of the plurality of electrode pads to be photographed by the photographing unit based on the layout information stored in the storage unit and enabling a photograph to be taken by the photographing unit when the photographing position changing unit positions the photographing position to coincide with the position of the part of the plurality of electrode pads.

5. The probe mark reading device of claim 1, further comprising a probe mark checking unit for determining quality of prescribed probe marks included in the image based on the image stored in the storage unit, wherein the probe mark checking unit comprises:
an initial vector calculator for calculating an initial vector equivalent to a vector drawn from a position of a pre-registered model probe mark relating to a prescribed electrode pad selected from the plurality of electrode pads to a probe mark position formed on the prescribed electrode pad; and
a probe mark quality determination unit for determining whether or not a probe mark formed on an electrode pad different to the prescribed electrode pad is detected within a prescribed determination range including a position in the direction and distance of the initial vector from the position of the pre-registered probe mark relating to the different electrode pad.

6. The probe mark reading device of claim 5, wherein the probe mark checking unit includes a probe mark position determination unit for determining whether or not a probe mark overlaps with a prescribed region set for the vicinity of the edge of an electrode pad including the probe mark detected by the probe mark quality determination unit.

7. The probe mark reading device of claim 5, wherein the probe mark checking unit further comprises a classification header generator for generating classification header information including information identifying each electrode pad included in the object and determination results of the probe mark quality determination unit and storing the classification header information correlating corresponding electrode pad images in the storage unit.

8. The probe mark reading device of claim 5, wherein the initial vector calculator comprises:
a detector for detecting probe marks formed by the electrical characteristic check by performing a difference operation on the images saved in the storage unit and images for the prescribed electrode pads taken in advance before checking the electrical characteristics; and
a calculator for calculating an initial vector equivalent to the vector from the position of the probe mark taken as the pre-registered model correlating to the prescribed electrode pad to the position of the probe mark detected by the detector.

9. The probe mark reading device of claim 5,
wherein the initial vector calculator calculates the initial vector based on the vector from the position ohhc probe mark that is the pre-registered model correlating to each of the electrode pads for four electrodes positioned in the vicinity of the corners of the object to the position of the probe mark formed on each of the elcctrode pads, and
the probe mark quality determination unit determines whether or not a probe mark formed on an electrode pad different to the prescribed four electmde pads is detected within a prescribed determination range including a position in the direction and distance of the initial vector from the position of the pre-registered probe mark relating to the different electrode pad.

10. A probe mark reading method for reading probe marks formed on elcctrode pads during checking of electrical characteristics of a prescribed object including a plurality of electrode pads, comprising:

an illuminating step of illuminating the plurality of electrode pads;
a photographing step of photographing a part of the plurality of electrode pads illuminated in the illuminating step and outputting images obtained by photographing as electrical signals;
an image position changing step of enabling photographing all the plurality of electrode pads by consecutively changing a photographing position to be photographed in the photographing step; and
a storage step of receiving the electrical signals outputted in the photographing step and saving images obtained from the electrical signals.
wherein an image of the part of the plurality of electrode pads to be photographed in the photographing step is supplied for just a prescribed time in which the photographing position changing unit positions the photographing position to coincide with the position of the part of the plurality of electrode pads.

11. The probe mark reading method of claim 10, wherein the photographing position changing step is such that the photographing position is changed at a predefined moving speed so as to enable photographing in order of images for all of the electrode pads in such a manner as to open up a time gap of photographing time required to acquire a single image in the case of consecutive photographing in the photographing step or longer.

12. The probe mark reading method of claim 10, wherein the illuminating step is such that an image of the part of the plurality of electrode pads to be photographed in the photographing step is supplied by generating a flash of light for just a prescribed time in which the part of the plurality of electrode pads is to be photographed in the photographing step.

13. The probe mark reading method of claim 10, further comprising a probe mark checking step of determining quality of prescribed probe marks included in the image based on the image stored in the storage step, wherein
the probe mark checking step comprises:
an initial vector calculating step of calculating an initial vector equivalent to a vector drawn from a position of a pre-registered model probe mark relating to a prescribed electrode pad selected from the plurality of electrode pads to a probe mark position formed on the prescribed electrode pad; and
a probe mark quality determination step of determining whether or not a probe mark formed on an electrode pad different to the prescribed electrode pad is detected within a prescribed determination range including a position in the direction and distance of the initial vector from the position of the pre-registered probe mark relating to the different electrode pad.

* * * * *